(12) United States Patent
Kiuchi et al.

(10) Patent No.: US 10,948,821 B2
(45) Date of Patent: Mar. 16, 2021

(54) PHOTOSENSITIVE RESIN COMPOSITION

(71) Applicant: TORAY INDUSTRIES, INC., Tokyo (JP)

(72) Inventors: Yohei Kiuchi, Otsu (JP); Yu Shoji, Otsu (JP); Kimio Isobe, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 151 days.

(21) Appl. No.: 16/084,496

(22) PCT Filed: Mar. 24, 2017

(86) PCT No.: PCT/JP2017/012086
§ 371 (c)(1),
(2) Date: Sep. 12, 2018

(87) PCT Pub. No.: WO2017/170249
PCT Pub. Date: Oct. 5, 2017

(65) Prior Publication Data
US 2019/0025697 A1    Jan. 24, 2019

(30) Foreign Application Priority Data

Mar. 28, 2016 (JP) ................................ 2016-063640

(51) Int. Cl.
*G03F 7/037* (2006.01)
*G03F 7/027* (2006.01)
(Continued)

(52) U.S. Cl.
CPC .............. *G03F 7/037* (2013.01); *C08L 83/08* (2013.01); *C09D 183/04* (2013.01);
(Continued)

(58) Field of Classification Search
CPC ....................................................... G03F 7/00
See application file for complete search history.

(56) References Cited

U.S. PATENT DOCUMENTS

2008/0193718 A1*  8/2008  Suwa ................. G03F 7/0233
428/156

FOREIGN PATENT DOCUMENTS

JP    1-105242 A    4/1989
JP    3-281616 A    12/1991
(Continued)

OTHER PUBLICATIONS

International Search Report (PCT/ISA/210) issued in PCT/JP2017/012086, dated Jun. 20, 2017.
(Continued)

*Primary Examiner* — Chanceity N Robinson
(74) *Attorney, Agent, or Firm* — Birch, Stewart, Kolasch & Birch, LLP

(57) ABSTRACT

A photosensitive resin composition includes an alkali-soluble resin (A) containing at least one selected from polyimides and precursors thereof, and polybenzoxazoles and precursors thereof, and a (meth)acryl group-containing compound (B) which constitutes a polyfunctional (meth)acryl group-containing silane condensate (B1) having a weight average molecular weight of 1,000 to 20,000, and having a plurality of structures represented by Formula (1), which is a condensate of compounds having a structure represented by Formula (1) and at least one structure selected from Formula (2-1), Formula (2-2), and Formula (2-3).

[Chem. 1]

$$H_2C=C(R^1)-C(=O)-O-(CH_2)_m-*\quad (1)$$

(Continued)

-continued

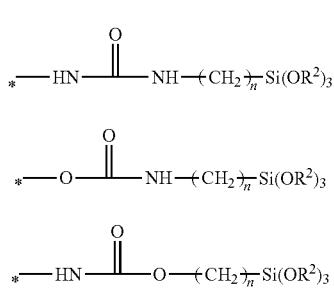

(2-1)

(2-2)

(2-3)

6 Claims, 2 Drawing Sheets

(51) Int. Cl.
C09D 183/08 (2006.01)
C09D 183/04 (2006.01)
G03F 7/075 (2006.01)
C08L 83/08 (2006.01)
C08G 77/26 (2006.01)
C08G 77/20 (2006.01)
C08L 65/00 (2006.01)

(52) U.S. Cl.
CPC ........... *C09D 183/08* (2013.01); *G03F 7/027* (2013.01); *G03F 7/0755* (2013.01); *G03F 7/0757* (2013.01); *C08G 77/20* (2013.01); *C08G 77/26* (2013.01); *C08L 65/00* (2013.01)

(56) References Cited

FOREIGN PATENT DOCUMENTS

| JP | 2007-328363 A | 12/2007 |
| JP | 2008-298862 A | 12/2008 |
| JP | 2009-288703 A | 12/2009 |
| JP | 2011194681 A * | 10/2011 |
| JP | 2014-048569 A | 3/2014 |
| JP | 2016-024319 A | 2/2016 |
| WO | WO 2010/067685 A1 | 6/2010 |

OTHER PUBLICATIONS

Written Opinion (PCT/ISA/237) issued in PCT/JP2017/012086, dated Jun. 20, 2017.

* cited by examiner

[Fig. 1]
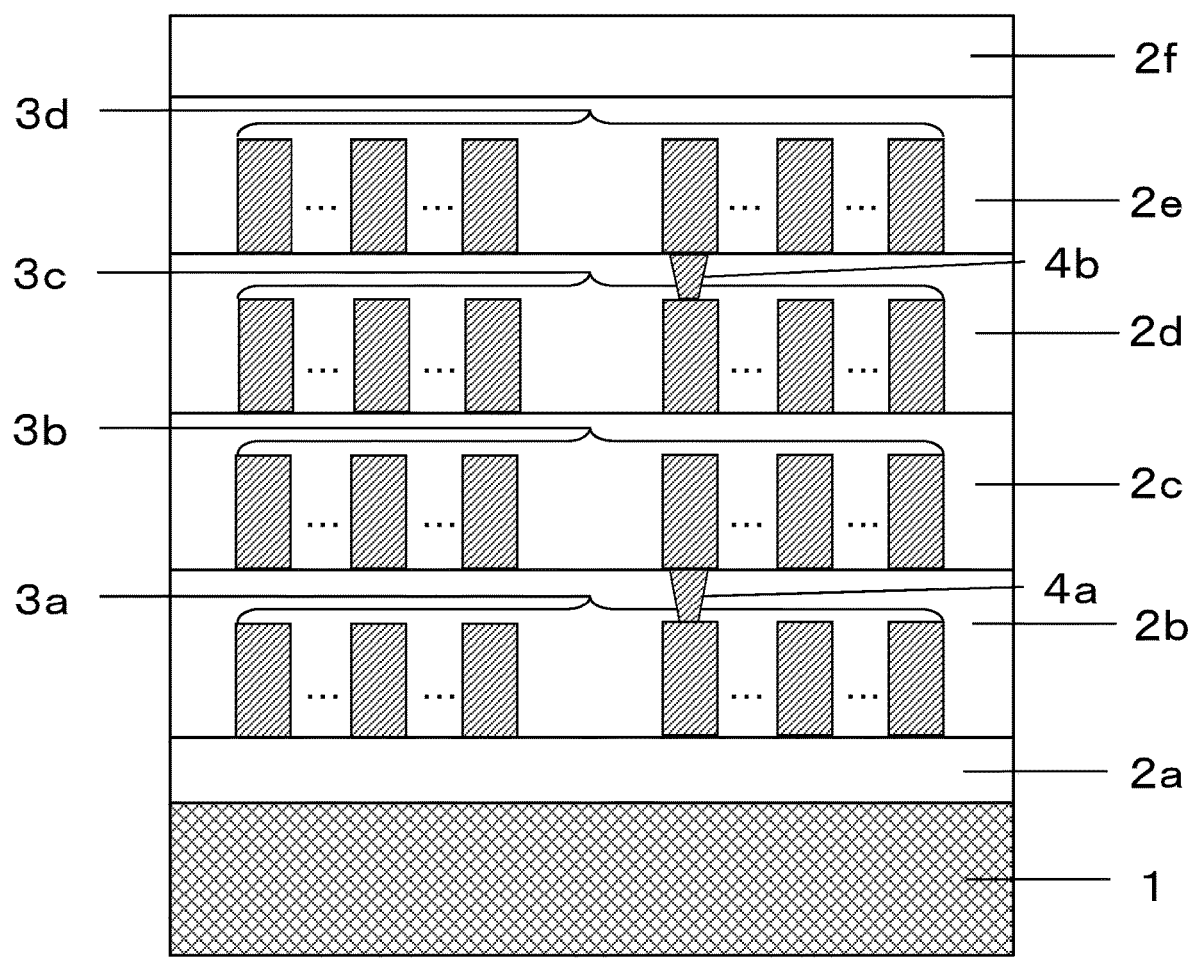

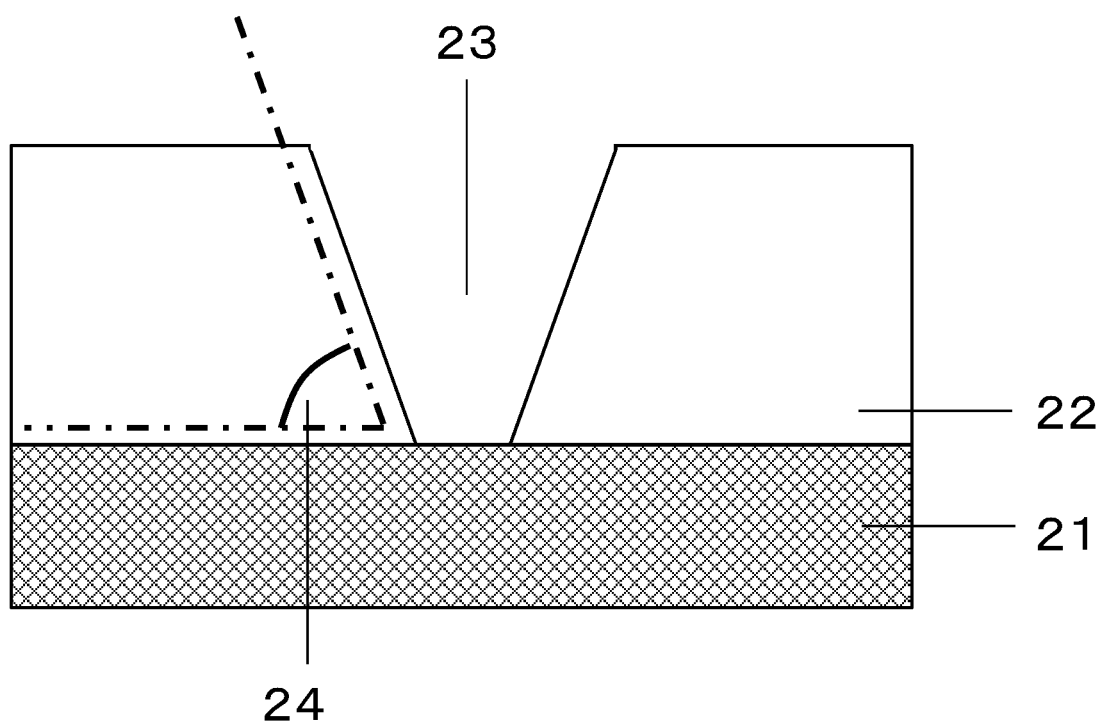
[Fig. 2]

PHOTOSENSITIVE RESIN COMPOSITION

TECHNICAL FIELD

The present invention relates to a photosensitive resin composition and a method of producing a photosensitive resin film. More specifically, the present invention relates to a photosensitive resin composition, which is suitable for the application such as in a passivation film or an insulating film for rewiring of a semiconductor device, an interlayer insulating film of a thin film inductor, an insulating film of an organic electroluminescence element, a planarizing film of a thin film transistor substrate for driving a display device which uses an organic electroluminescence element, a wiring protection insulating film of a circuit substrate, an on-chip microlens of a solid state image sensor, and planarizing film for various displays and solid state image sensors, and to a method of producing a photosensitive resin film.

Hereinafter, the electroluminescence is referred to as "EL", and the thin film transistor is referred to as "TFT"

BACKGROUND ART

A resin such as polyimide or polybenzoxazole is used in a passivation film of a semiconductor device or the like, an interlayer insulating film of a thin film inductor, an insulating layer of an organic EL element, a planarizing film of a TFT substrate, etc. because of its excellent mechanical properties, heat resistance, electrical insulation property, chemical resistance and the like.

Recent years, an electronic component called thin film inductor has gained attention. This thin film inductor has a spiral thin film coil structure formed on the substrate by repeating steps such as photolithography, plating, and the like. This thin film inductor is used for a purpose such as a common mode filter of a wearable device and a mobile device such as a smartphone, a tablet terminal, and a digital camera, or the like.

Particularly, as electronic devices represented by smartphones have become more sophisticated and multi-functional, the number of components has increased, resulting in the reduction of the space per component. Thus, the miniaturization and thinning of the parts have been demanded. A thin film inductor capable of saving space has been needed in such a product.

Conventionally, a semi-additive process is adopted for forming a coil pattern of such a thin film inductor. First of all, a photosensitive resin is spin-coated on a substrate as an insulating layer and then exposed to light and developed to form opening portions and through-hole portions. Then, the remaining resin is thermally cured to form an insulating layer. Subsequently, a base conductive layer is formed by a vapor deposition method or a sputtering method. By carrying out plating using this as a current feeder, a coil pattern is formed on the insulating layer. By repeating the process of forming an insulating layer and a coil pattern, a laminated coil structure can be formed (see, for example, Patent Document 1).

As the material of the insulating layer, a photosensitive resin which is excellent in electrical insulation and provides easy pattern processing is used. As a type of the photosensitivity, a negative type photosensitive resin is used, which provides easy processing of a thick film pattern because, when the negative type photosensitive resin is applied to form a thick insulating layer for covering a coil pattern, it is easier to achieve contrasting developing speeds between the exposed portion and the unexposed portion than in the case of a positive photosensitive resin (see, for example, Patent Documents 2 to 4). In particular, as a photosensitive resin which can withstand chemical treatments and heat treatments associated with the formation of a coil pattern and which can also provide a highly tough insulating layer capable of withstanding various stresses generated in a reliability test, a polyimide resin which is excellent in chemical resistance, heat resistance, mechanical properties, and electrical insulation property is used (see, for example, Patent Document 5).

PRIOR ART REFERENCES

Patent Documents

[PATENT DOCUMENT 1] JP2014-192487A
[PATENT DOCUMENT 2] JP2015-007762A
[PATENT DOCUMENT 3] JP2013-174643A
[PATENT DOCUMENT 4] WO2012/086370
[PATENT DOCUMENT 5] JP2013-200328A

SUMMARY OF THE INVENTION

Problems to be Solved by the Invention

A negative type photosensitive polyimide resin is coated as an insulating layer, and then exposed to light and developed to remove an unexposed portion. Thus, an opening portion is obtained. However, there is a problem that the cross-sectional shape tends to be a reverse taper because generally, the cross-linking reaction does not proceed until the bottom of the film at the exposed portion. When the cross-sectional shape of the opening portion of the resin is a reverse taper with a taper angle of 90° or more, the formation of a seed layer by vapor deposition or sputtering before the plating process becomes incomplete, causing a problem such as a poor electrical connection due to poor formation of plating. Therefore, the cross-sectional shape needs to be a forward taper with a taper angle of less than 90° at least.

Thus, an object of the present invention is to provide a photosensitive resin composition which is excellent in chemical resistance and electrical insulation property and which can form a cured relief pattern having a cross-sectional shape of a forward taper with a taper angle of less than 90° after curing.

Means for Solving the Problems

In order to solve the above problem, the photosensitive resin composition of the present invention has the following structure.

[1] A photosensitive resin composition, comprising an alkali-soluble resin (A) comprising at least one selected from polyimides and precursors thereof, and polybenzoxazoles and precursors thereof, and
a (meth)acryl group-containing compound (B),
wherein the (meth)acryl group-containing compound (B) comprises
a polyfunctional (meth)acryl group-containing silane condensate (B1) having a plurality of the structures represented by the general Formula (1), the silane condensate (B1) being a condensate of compounds having a structure represented by the general Formula (1) and at least one structure selected from the general Formula (2-1), the general Formula (2-2), and the general Formula (2-3), and the compound (B1) has a weight average molecular weight of 1,000 to 20,000.

[Chem 1]

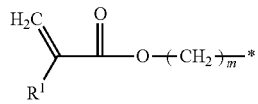
(1)

(wherein in the general Formula (1), $R^1$ is a hydrogen atom or a methyl group. m is an integer in a range of $1 \leq m \leq 4$. The symbol * indicates a binding site.)

[Chem 2]

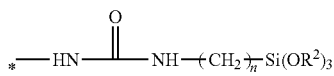
(2-1)

(wherein in the general Formula (2-1), $R^2$ is a methyl group or an ethyl group. n is an integer in a range of $1 \leq n \leq 4$. The symbol * indicates a binding site.)

[Chem 3]

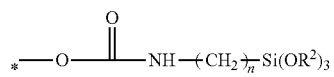
(2-2)

(wherein in the general Formula (2-2), $R^2$ is a methyl group or an ethyl group. n is an integer in a range of $1 \leq n \leq 4$. The symbol * indicates a binding site.)

[Chem 4]

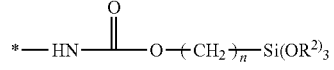
(2-3)

(wherein in the general Formula (2-3), $R^2$ is a methyl group or an ethyl group. n is an integer in a range of $1 \leq n \leq 4$. The symbol * indicates a binding site.) Preferred aspects of the above photosensitive resin composition are shown below.

[2] The photosensitive resin composition as described above, wherein the (meth)acryl group-containing compound (B) further comprises a polyfunctional (meth)acryl group-containing compound (B2).

[3] The photosensitive resin composition as described above, wherein the polyfunctional (meth)acryl group-containing compound (B2) comprises at least one selected from compounds represented by the general Formula (3) and compounds represented by the general Formula (4).

[Chem 5]

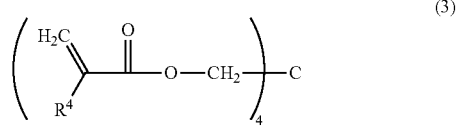
(3)

(wherein in the general Formula (3), $R^4$ is a hydrogen atom or a methyl group.

[Chem 6]

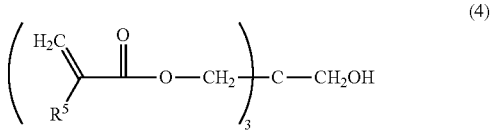
(4)

(wherein in the general Formula (4), $R^5$ is a hydrogen atom or a methyl group.

[4] The photosensitive resin composition according to any one of the above, wherein the polyfunctional (meth)acryl group-containing compound (B2) is 50 to 300 parts by mass based on 100 parts by mass of the total amount of the polyfunctional (meth)acryl group-containing silane condensate (B1).

[5] The photosensitive resin composition according to any one of the above, wherein the acryl group-containing compound (B) is 20 to 70 parts by mass based on 100 parts by mass of the (A) alkali-soluble resin (A).

The following items are obtained by using the photosensitive resin composition as described above.

[6] A resin sheet formed from the photosensitive resin composition according to any one of the above.

[7] A cured relief pattern which is obtained by curing the photosensitive resin composition according to any one of the above or the resin sheet as described above, wherein the relief pattern has a cross-sectional shape of a tapered shape with a taper angle of 45° or more and less than 90°.

[8] An interlayer insulating film or a passivation film, comprising a layer of the relief pattern as described above.

As a method of producing an interlayer insulating film or a passivation film, the following aspect is shown.

[9] A method of producing an interlayer insulating film or a passivation film, comprising the steps of:
forming a photosensitive resin composition layer or a resin layer on a substrate by a step of coating the above photosensitive resin composition on the substrate or a step of laminating the above resin sheet on the substrate,
forming a pattern by irradiation with ultraviolet rays and development; and
forming a layer of a cured relief pattern by heating.

The following aspects are shown, in which the resulting interlayer insulating film or passivation film is utilized.

[10] An electronic component or a semiconductor part, comprising a seed layer and a plated layer on a film selected from the above interlayer insulating film and the above surface protective film.

[11] An electronic component or a semiconductor component, comprising 2 to 10 layers of the above interlayer insulating films which are arranged repeatedly.

Effect of the Invention

According to the photosensitive resin composition of the present invention, a cured film which is excellent in chemical resistance and electrical insulation property can be obtained. In addition, according to the photosensitive resin composition of the present invention, a cured relief pattern having a cross-sectional shape of a forward taper with a taper angle of less than 90° after curing.

BRIEF DESCRIPTION OF THE DRAWINGS

FIG. 1 shows a diagram of a cross section of an electronic component, in which a multi-layer structure portion formed by laminating insulating layers and coil conductor layers alternately is enlarged.

FIG. 2 shows a diagram of an enlarged cross section of a silicon wafer and a cured relief pattern formed thereon.

MODE FOR CARRYING OUT THE INVENTION

The term "(meth)acryl" used herein collectively means "methacryl" and "acryl". In other words, "(meth)acryl" may be "methacryl" or "acryl".

The photosensitive resin composition of the present invention contains an alkali-soluble resin (A) containing at least one selected from polyimides and precursors thereof, and polybenzoxazoles and precursors thereof. These resins can be polymers having an imide ring, an oxazole ring or another cyclic structure by heating or by a catalyst.

Among polyimides and precursors thereof and polybenzoxazoles and precursors thereof, preferred examples include polyimides, polyamic acids and polyamic acid esters which are polyimide precursors, and polyhydroxyamides which are polybenzoxazole precursors. By forming a cyclic structure, heat resistance and chemical resistance are dramatically improved.

The alkali-soluble resin herein has an alkali-soluble group in a repeating unit of the resin and is soluble in an alkali solution. Examples of alkali-soluble groups include carboxyl groups, phenolic hydroxyl groups, sulfonic acid groups, thiol groups and the like.

The alkali-soluble resin preferably has following characteristics as the solubility in alkali. When the thin film of the resin is dipped in a 2.38% by weight aqueous solution of tetramethylammonium hydroxide at 23±1° C. for 3 minutes, the film thickness preferably decreases by 150 nm or more. As a specific measurement method, a solution of 39% by mass prepared by dissolving the resin in γ-butyrolactone is coated on a silicon wafer, prebaked at 120° C. for 4 minutes to form a film of the resin having a film thickness of 10 μm±0.5 μm. After the thin film of the resin is dipped in a 2.38% by weight aqueous solution of tetramethylammonium hydroxide at 23±1° C. for 3 minutes, a resin whose film thickness decreases by 150 nm or more is preferred. As a solvent for the resin in this measurement, γ-butyrolactone is preferred, but other solvents may be used.

Polyimides can be obtained by reacting a tetracarboxylic acid, a corresponding tetracarboxylic dianhydride, a tetracarboxylic acid diester dichloride, or the like with a diamine, a corresponding diisocyanate compound, a trimethylsilylated diamine, or the like. Polyimide has a tetracarboxylic acid residue and a diamine residue. For example, a polyamic acid, which is one of the polyimide precursors and is obtained by reacting a tetracarboxylic dianhydride with a diamine, can be subjected to dehydration ring closure by a heat treatment to obtain a polyimide. During this heat treatment, a solvent azeotropic with water such as m-xylene can be added. Alternatively, polyimide can be also obtained by adding a dehydration-condensation agent such as a carboxylic anhydride or dicyclohexylcarbodiimide, a base such as triethylamine, or the like as a ring-closing catalyst to perform dehydration ring closure by a chemical heat treatment. Alternatively, polyimide can be also obtained by adding a weakly acidic carboxylic acid compound and carrying out the dehydration ring closure by a heat treatment at a low temperature of 100° C. or less. The polyimide precursors will be described later.

Polybenzoxazoles can be obtained by reacting a bis-aminophenol compound with a dicarboxylic acid, a corresponding dicarboxylic acid chloride, a dicarboxylic acid active ester, or the like, and has a dicarboxylic acid residue and a bis-aminophenol residue. One example of the synthesis method of a polybenzoxazole includes subjecting a polyhydroxyamide, which is one of the polybenzoxazole precursors and is obtained by reacting a bis-aminophenol compound with a dicarboxylic acid, to a heat treatment and thus to dehydration ring closure to obtain a polybenzoxazole. Another method includes performing the dehydration ring closure through a chemical treatment by adding phosphoric anhydride, a base, a carbodiimide compound or the like to the polyhydroxyamide to obtain a polybenzoxazole. The polybenzoxazole precursors will be described later.

In the present invention, the polyimide preferably has, from the viewpoint of the solubility in an aqueous alkali solution, an acid group or an acid group derivative represented by —$OR^6$, —$SO_3R^6$, —$CONR^6R^7$, —$COOR^6$, —$SO_2NR^6R^7$ or the like in the tetracarboxylic acid residue and/or the diamine residue, and more preferably has a hydroxyl group.

$R^6$ and $R^7$ are each independently a hydrogen atom or a monovalent $C_1$-$C_{20}$ organic group. The acid group indicates the case in which $R^6$ and $R^7$ are both hydrogen atoms, and the acid group derivative indicates the case in which $R^6$ or $R^7$ includes a monovalent $C_1$-$C_{20}$ organic group. Examples of organic groups include alkyl groups, alkoxyl groups, ester groups and the like.

In addition, the polybenzoxazole has preferably an acid group or an acid group derivative represented by —$OR^6$, —$SO_3R^6$, —$CONR^6R^7$, —$COOR^6$, —$SO_2NR^6R^7$ or the like in the dicarboxylic acid residue and/or the bis-aminophenol residue, and more preferably has a hydroxyl group. $R^6$ and $R^7$ are each independently a hydrogen atom or a monovalent $C_1$-$C_{20}$ organic group. The acid group indicates the case in which $R^6$ and $R^7$ are both hydrogen atoms, and the acid group derivative indicates the case in which $R^6$ or $R^7$ includes a monovalent $C_1$-$C_{20}$ organic group. Examples of organic groups include alkyl groups, alkoxyl groups, ester groups and the like.

In the present invention, examples of preferred structures of tetracarboxylic acid residues of the polyimide and dicarboxylic acid residues of the polybenzoxazole (hereinafter collectively referred to as acid residues) include the following structures and structures obtained by partially substituting 1 to 4 hydrogen atoms in the following structures by a $C_1$-$C_{20}$ alkyl group, a fluoroalkyl group, an alkoxyl group, an ester group, a nitro group, a cyano group, a fluorine atom, or a chlorine atom.

[Chem 7]

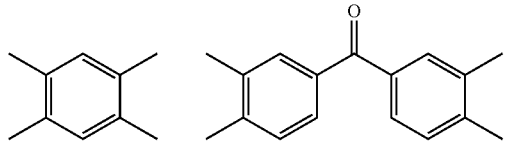

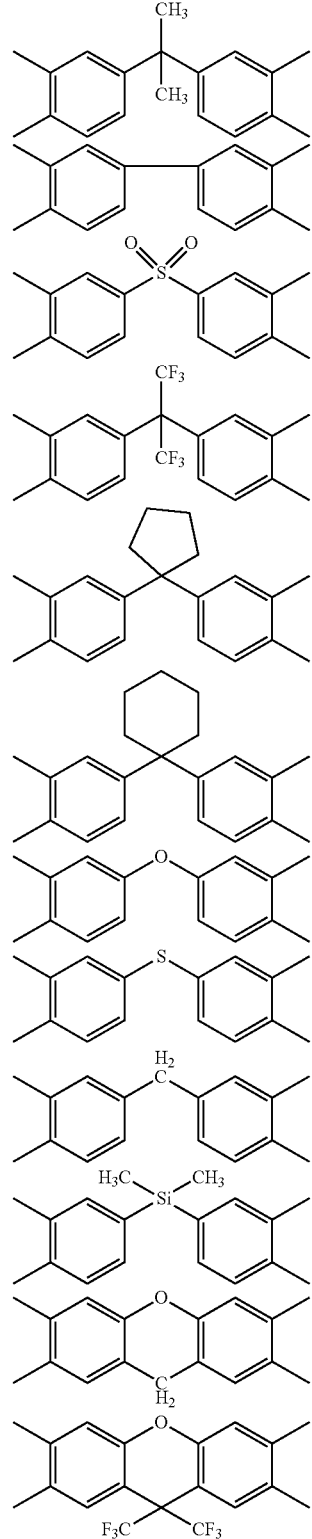
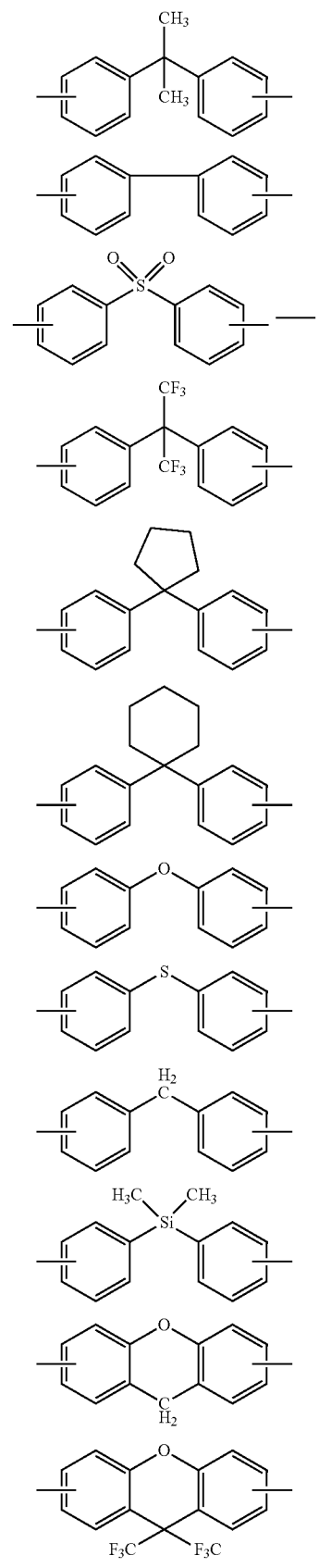
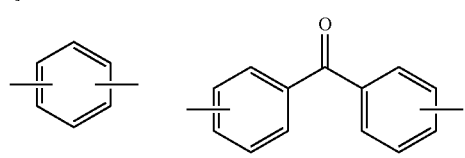

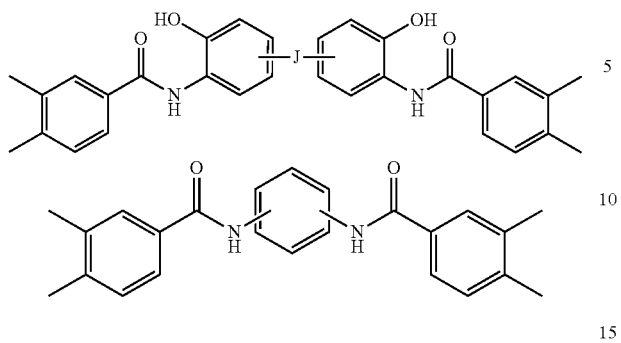

In Formulas, J represents any of a direct bonding, —COO—, —CONH—, —CH$_2$—, —C$_2$H$_4$—, —O—, —C$_3$H$_6$—, —C$_3$F$_6$—, —SO$_2$—, —S—, —Si(CH$_3$)$_2$—, —OSi(CH$_3$)$_2$—O—, —C$_6$H$_4$—, —C$_6$H$_4$—O—C$_6$H$_4$—, —C$_6$H$_4$—C$_3$H$_6$—C$_6$H$_4$—, and —C$_6$H$_4$—C$_3$F$_6$—C$_6$H$_4$—.

In the present invention, examples of preferred structures of diamine residues of the polyimide and bis-aminophenol residues of the polybenzoxazole (hereinafter collectively referred to as diamine residues) include the following structures and structures obtained by partially substituting 1 to 4 hydrogen atoms in the following structures by a C$_1$-C$_{20}$ alkyl group, a fluoroalkyl group, an alkoxyl group, an ester group, a nitro group, a cyano group, a fluorine atom, or a chlorine atom.

[Chem 10]

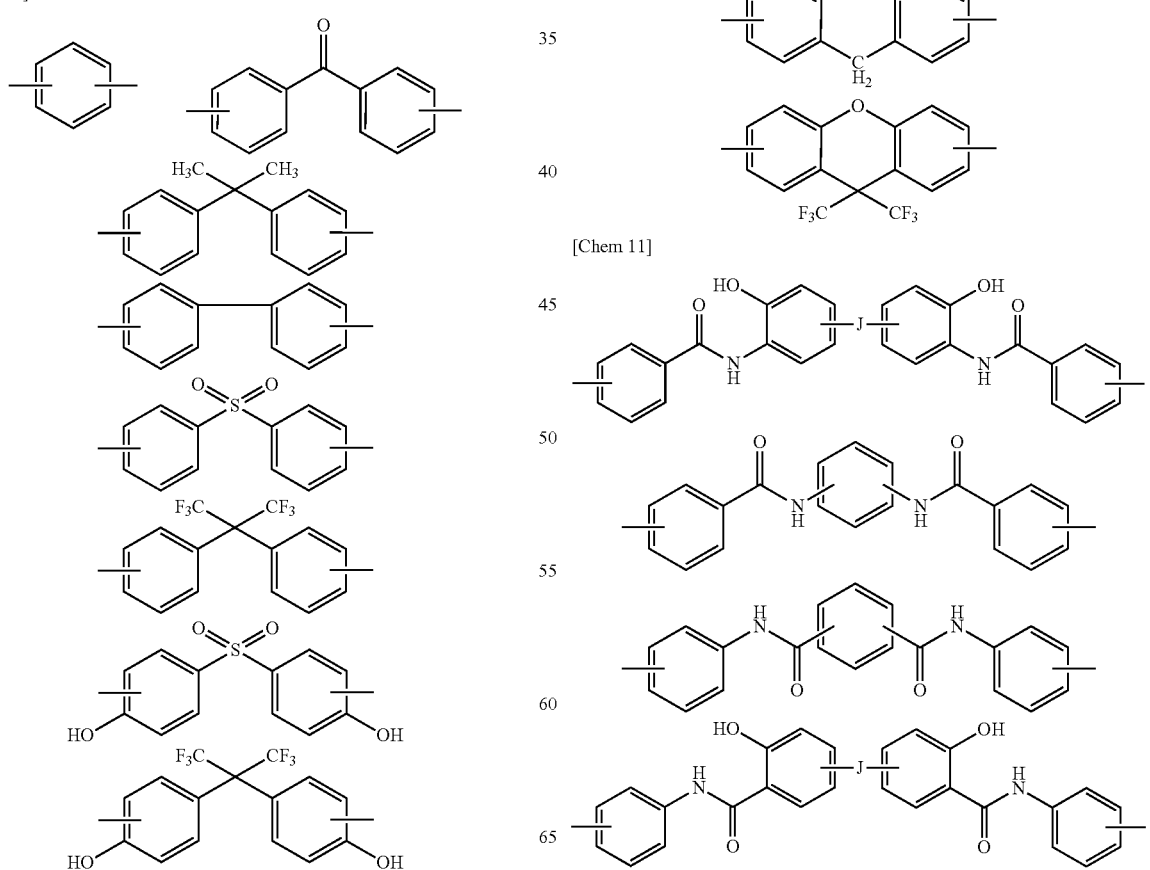

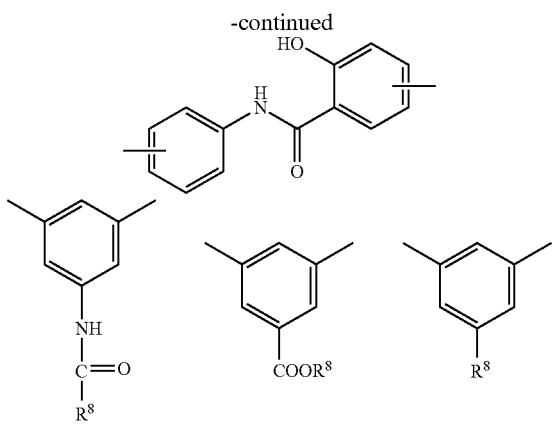

In Formulas, each J represents any of a direct bonding, —COO—, —CONH—, —CH$_2$—, —C$_2$H$_4$—, —O—, —C$_3$H$_6$—, —C$_3$F$_6$—, —SO$_2$—, —S—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$—, or —C$_6$H$_4$—C$_3$F$_6$—C$_6$H$_4$—. Each R$^8$ is independently a hydrogen atom or a monovalent C$_1$-C$_{20}$ organic group.

In the present invention, the polyimide precursors and the polybenzoxazole precursors are resins having an amide bond in the main chain and undergo dehydration ring closure through a heat treatment or a chemical treatment to form the polyimide and polybenzoxazole as described above. The repetition number of structural units is preferably 10 to 100,000. Examples of polyimide precursors include polyamic acids, polyamic acid esters, polyamic acid amides, polyisoimides and the like. Polyamide acids and polyamic acid esters are preferred. Examples of polybenzoxazole precursors include polyhydroxyamides, polyaminoamides, polyamides, polyamide imides and the like, and polyhydroxyamides are preferred.

The polyimide precursors and the polybenzoxazole precursors preferably have, from the viewpoint of the solubility in an aqueous alkali solution, an acid group or an acid group derivative represented by OR$^9$, SO$^3$R$^9$, CONR$^9$R$^{10}$, COOR$^9$, SO$_2$NR$^9$R$^{10}$ or the like in the acid residue or the diamine residue, and more preferably a hydroxyl group. R$^9$ and R$^{10}$ represent each independently a hydrogen atom or a monovalent C$_1$-C$_{20}$ organic group. The acid group indicates the case in which R$^9$ and R$^{10}$ are both hydrogen atoms, and the acid group derivative indicates the case in which R$^9$ or R$^{10}$ includes a monovalent C$_1$-C$_{20}$ organic group. Examples of organic groups include alkyl groups, alkoxyl groups, ester groups and the like.

Examples of acid components that constitute the acid residues in the polyimide precursors and the polybenzoxazole precursors are shown as below.

Examples of dicarboxylic acids include terephthalic acid, isophthalic acid, diphenyl ether dicarboxylic acid, bis(carboxyphenyl)hexafluoropropane, biphenyl dicarboxylic acid, benzophenone dicarboxylic acid, triphenyl dicarboxylic acid and the like.

Examples of tricarboxylic acids include trimellitic acid, trimesic acid, diphenyl ether tricarboxylic acid, biphenyltricarboxylic acid and the like.

Examples of aromatic tetracarboxylic acids among the tetracarboxylic acids include pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenone tetracarboxylic acid, 2,2',3,3'-benzophenone tetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl) sulfone, bis(3,4-dicarboxyphenyl)ether, 1,2,5,6-naphthalene tetracarboxylic acid, 2,3,6,7-naphthalene tetracarboxylic acid, 2,3,5,6-pyridine tetracarboxylic acid, 3,4,9,10-perylene tetracarboxylic acid and the like.

Examples of aliphatic carboxylic acids among the tetracarboxylic acids include butanetetracarboxylic acid, cyclobutane tetracarboxylic acid, 1,2,3,4-cyclopentane tetracarboxylic acid, cyclohexane tetracarboxylic acid, bicyclo[2.2.1.]heptane tetracarboxylic acid, bicyclo[3.3.1.]tetracarboxylic acid, bicyclo[3.1.1.]hept-2-ene tetracarboxylic acid, bicyclo[2.2.2.]octane tetracarboxylic acid, adamantane tetracarboxylic acid and the like.

In addition, in the above-mentioned dicarboxylic acids, tricarboxylic acids, and tetracarboxylic acids, hydrogen atoms are preferably substituted partially by an acid group or an acid group derivative represented by —OR$^9$, —SO$_3$R$^9$, —CONR$^9$R$^{10}$, —COOR$^9$, —SO$_2$NR$^9$R$^{10}$ or the like. More preferably, 1 to 4 hydrogen atoms are partially substituted by a hydroxyl group, a sulfonic acid group, a sulfonic acid amide group, a sulfonic acid ester group or the like. R$^9$ and R$^{10}$ represent each independently a hydrogen atom or a monovalent C$_1$-C$_{20}$ organic group.

These acids can be used as raw materials directly or in the form of acid anhydride or active ester. Two kinds or more of these may be also used.

Silicon atom-containing tetracarboxylic acids such as dimethylsilane diphthalic acid and 1,3-bis(phthalic acid) tetramethyldisiloxane can also be used. The use of this acid can enhance the adherence property to a substrate and the resistance to oxygen plasma and UV ozone treatment used for cleaning, etc. These silicon atom-containing tetracarboxylic acids are preferably used at 1 to 30% by mole of the total acid components. From the viewpoint of the adherence property to a substrate and the achievement of the effect on plasma treatment, 1% by mole or more is preferred. From the viewpoint of the solubility of the resulting resin in an aqueous alkali solution, 30% by mole or less is preferred.

Examples of diamine components that constitute diamine residues of the polyimide precursors and the polybenzoxazole precursors are shown as below.

Examples of hydroxyl group-containing diamines include 2,2-bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, bis(3-amino-4-hydroxyphenyl)fluorene and the like.

Examples of carboxyl group-containing diamines include 3,5-diaminobenzoic acid, 3-carboxy-4,4'-diaminodiphenyl ether and the like.

Other examples include, as sulfonic acid-containing diamines, 3-sulfonic acid-4,4'-diaminodiphenyl ether and the like. Dithiohydroxyphenylenediamine, 3,4'-diaminodiphenyether, 4,4'-diaminodiphenyether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4- aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-di(trifluoromethyl)-4,4'-diaminobiphenyl are also included.

Compounds obtained by substituting partially hydrogen atoms on an aromatic ring of the above diamines by an alkyl group or a halogen atom such as F, Cl, Br or I are also included.

Aliphatic diamines such as cyclohexyldiamine and methylenebiscyclohexylamine are also included.

Furthermore, hydrogen atoms of these diamines may be substituted partially by a $C_1$-$C_{10}$ alkyl group such as a methyl group or an ethyl group, a $C_1$-$C_{10}$ fluoroalkyl group such as a trifluoromethyl group, or a halogen atom such as F, Cl, Br or I. Moreover, the diamines as shown above have preferably an acid group or an acid group derivative represented by —$OR^9$, —$SO_3R^9$, —$CONR^9R^{10}$, —$COOR^9$, —$SO_2NR^9R^{10}$, and more preferably have a hydroxyl group. $R^9$ and $R^{10}$ represent each independently a hydrogen atom or a monovalent $C_1$-$C_{20}$ organic group.

These diamines can be used as raw materials directly, or diisocyanate compounds having the same skeleton as a diamine can be used as raw materials. Further, a compound obtained by trimethylsilylating an amino group of a diamine can be used as a trimethylsilylated diamine. Two kinds or more of these can be used. In an application that requires heat resistance, an aromatic diamine is preferably used at 50% by mole or more of the total diamines.

The use of a silicon atom-containing diamine such as 1,3-bis(3-aminopropyl)tetramethyldisiloxane or 1,3-bis(4-anilino)tetramethyldisiloxane as a diamine component can enhance the adherence property to a substrate and the resistance to oxygen plasma and UV ozone treatment used for cleaning, etc. These silicon atom-containing diamines are preferably used in the range of 1 to 30% by mole with respect to all diamines. In order to improve the adherence property and resistance to a plasma treatment, 1% by mole or more is preferred. From the viewpoint of the solubility of the resulting resin in an aqueous alkali solution, 30% by mole or less is preferred.

In addition, the ends of the polyimide, polybenzoxazole, and precursors thereof are preferably sealed with an end capping agent such as a monoamine, an acid anhydride, a monocarboxylic acid, or an acid chloride having a hydroxyl group, a carboxyl group, a sulfonic acid group, or a thiol group. Two kinds or more of these can be used. When the resin ends have a group as shown above, the rate of dissolution of the resin in an aqueous alkali solution can be easily adjusted to a preferred range.

Preferred examples of monoamines are shown below. 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 2-hydroxy-3-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-amino-4-tert-butylphenol, 2-aminothiophenol, 3-aminothiophenol, 4-aminothiophenol, and the like.

Preferred examples of acid anhydrides, monocarboxylic acids and acid chlorides are shown as follows.

Acid anhydrides such as phthalic anhydride, maleic anhydride, nadic anhydride, cyclohexane dicarboxylic anhydride, and 3-hydroxy phthalic anhydride.

Monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid. In addition, monoacid chloride compounds obtained by subjecting a carboxyl group of the above compounds to acid chlorination.

Compounds obtained by subjecting to acid chlorination only one carboxyl group of dicarboxylic acid compounds exemplified by terephthalic acid, phthalic acid, maleic acid, cyclohexane dicarboxylic acid, 1,5-dicarboxynaphthalene, 1,6-dicarboxynaphthalene, 1,7-dicarboxynaphthalene and 2,6-dicarboxynaphthalene.

Active ester compounds obtained by a reaction of a monoacid chloride compound with N-hydroxybenzotriazole or N-hydroxy-5-norbornene-2,3-dicarboxyimide, and the like.

When a monoamine is added as an end capping agent, the content thereof is preferably in the range of 0.1 to 60% by mole of the number of moles of diamine, and more preferably of 5 to 50% by mole. When an acid anhydride, a monocarboxylic acid or an acid chloride is added as an end capping agent, the total content thereof is preferably in the range of 0.1 to 60% by mole of the number of moles of dicarboxylic acid, and more preferably of 5 to 50% by mole. In such a range, it is possible to obtain a photosensitive resin composition which has an appropriate viscosity of a solution for applying the photosensitive resin composition and which has excellent film physical properties.

The end capping agent introduced in the resin can be detected easily according to the following methods. For example, the resin in which the end capping agent has been introduced is dissolved in an acidic solution to decompose the resin into structural units of the resin, which are a diamine component and an acid component. The end capping agent can be easily detected by measuring the product by product gas chromatography (GC) or NMR. In a different way, the detection is also possible by measuring directly the resin in which the end capping agent has been introduced by pyrolysis gas chromatography (PGC), infrared spectrum or $^{13}$C-NMR spectrum.

Further, the ends of the resin may have a polymerizable functional group or a cross-linkable functional group. Examples of polymerizable functional groups include ethylenically unsaturated bonds, acetylene groups and the like. Examples of cross-linkable functional groups include methylol groups, alkoxymethyl groups and the like.

In the present invention, a component of the alkali-soluble resin (A) is preferably a polyimide, a polyimide precursor or a polybenzoxazole precursor, and more preferably a polyimide.

The photosensitive resin composition of the present invention may contain another kind of alkali-soluble resin (A') in addition to the above alkali-soluble resin (A). Specific examples of such an alkali-soluble resin (A') include polyacrylic acids, phenol-novolac resins, polyhydroxystyrene, polysiloxanes having a hydroxyl group, and the like.

The acid groups of these resins may be protected to control the alkali solubility. In addition to tetramethylammonium hydroxide, such a resin is dissolved in an aqueous alkali solution of, such as, choline, triethylamine, dimethylaminopyridine, monoethanolamine, diethylaminoethanol, sodium hydroxide, potassium hydroxide, sodium carbonate or the like. Although two or more of these resins may be contained, it is preferred that the ratio of (A) to the whole resin is 70% by mass or less in order to obtain a resin film having excellent film properties after the thermal curing.

The photosensitive resin composition of the present invention can provide a forward taper with a taper angle of 45° or more and less than 90° as the cross-sectional shape after curing.

A measurement example of the taper angle in the cross section of the pattern after curing will be explained with reference to FIG. 2. FIG. 2 shows an enlarged cross section of a silicon wafer and a cured relief pattern formed thereon. The cured relief pattern 22 is formed on the silicon wafer 21 and an opening portion 23 is present. The value of the taper angle can be obtained by measuring the angle of the taper 24.

The taper angle in the cross section of the pattern after curing is preferably 45° or more and less than 90°, more preferably 60° or more and less than 90°, and further preferably 75° or more and less than 90°.

When the cross-sectional shape of the cured film is a forward taper with a taper angle of less than 90°, a seed layer and a plating layer are sufficiently formed by vapor deposition or sputtering prior to the plating treatment. As a result, a coil pattern or a metal wiring with good electrical connection can be formed. The reasons for the achievement of such as effect are assumed as follows.

The (meth)acryl group-containing compound (B) contains a compound having a plurality of acryl groups. Therefore, a cross-linking reaction occurs due to the presence of active species such as radicals and cations generated during the exposure step. This cross-linking reaction progresses efficiently at any portion from the surface to the bottom of the exposed portion, resulting in polymerization and insolublization in an alkali developing solution.

Further, the (meth)acryl group-containing compound (B) contains a polyfunctional (meth)acryl group-containing silane condensate (B1).

The compound obtained by binding a structure represented by the general Formula (1) and at least one structure selected from the general Formula (2-1), the general Formula (2-2), and the general Formula (2-3) via the "*" of the chemical formulas can be considered as an intermediate raw material. This intermediate raw material has an alkoxysilyl group, and thus a plurality of the compounds undergo hydrolysis and condensation to bind to each other via siloxane. This is the polyfunctional (meth)acryl group-containing silane condensate (B1) of the present invention.

Since the polyfunctional (meth)acryl group-containing silane condensate (B1) has a structure of Si—$(CH_2)_n$— in the side chain portion of the polymer which is insolubilized due to the cross-linking reaction by exposure, the insolubilized portion has increased hydrophobicity and the rate of the dissolution in an alkali developing solution is reduced. It is believed that, along with the improvement of the ratio of the residual film at the time of development, the excessive dissolution at the bottom of the pattern at the time of development is also prevented, thereby forming a shape of a forward taper.

The polyfunctional (meth)acryl group-containing silane condensate (B1) has a high molecular weight and has a urea bond or a urethane bond which is excellent in heat resistance. Furthermore, a three-dimensional network structure is formed in which the cross-linked structure by the (meth)acryl groups formed at the time of the exposure and the siloxane structure generated by the hydrolysis reaction of the alkoxy groups bound to silicon are combined. Having a urea bond or a urethane bond and having a three-dimensional network structure increase the thermal decomposition temperature of the cured product. Therefore, it is believed that the shrinkage and the loss of the shape of the pattern of the photosensitive resin composition of the present invention at the time of the thermal curing are prevented, and that the shape of the forward taper obtained during the development is retained even after the thermal curing.

The presence of the (meth)acryl group-containing compound (B) in an amount appropriate with regard to the alkali-soluble resin (A) can provide a cross-sectional shape of a forward taper, which is excellent in chemical resistance and electrical insulation property.

The content of the (meth)acryl group-containing compound (B) is preferably 20 parts by mass to 70 parts by mass based on 100 parts by mass of the alkali-soluble resin (A). The content of 20 parts by mass or more is preferred from the viewpoint of the formation of a forward taper, and more preferably 25 parts by mass or more. The content of 70 parts by mass or less is preferred because excellent film properties such as the chemical resistance and the electrical insulation property inherent to the alkali-soluble resin (A) are obtained, and because the alkali development performance enhances without the curing of the unirradiated portion due to the progress of excessive photopolymerization. The content is more preferably 65 parts by mass or less.

The polyfunctional (meth)acryl group-containing silane condensate (B1) is a condensate of compounds having a structure represented by the general Formula (1) and at least one structure selected from the general Formula (2-1), the general Formula (2-2), and the general Formula (2-3). More preferably, the polyfunctional (meth)acryl group-containing silane condensate (B1) is a condensate of compounds having a structure represented by the general Formula (1) and a structure represented by the general Formula (2-1). The polyfunctional (meth)acryl group-containing silane condensate (B1) can be used alone, or two kinds or more thereof can be used in combination.

As an example of the polyfunctional (meth)acryl group-containing silane condensate (B1), a compound having an isocyanate group and an acryl group in the molecule and a compound having an amino group and a trialkoxysilyl group are reacted and further subjected to a reaction of hydrolysis and condensation. Thus, a condensate having a structure represented by the general Formula (1) and a structure represented by the general Formula (2-1) is obtained.

The compound having an isocyanate group and an acryl group in the molecule is not particularly limited, but preferably has a structure represented by, for example, the general Formula (5).

[Chem 12]

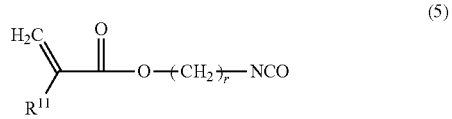

(5)

(wherein in the general Formula (5), $R^{11}$ is a hydrogen atom or a methyl group. r is an integer of 1 to 10.)

Examples of the compounds represented by the general Formula (5) include 2-isocyanatoethyl acrylate, 2-isocyanatoethyl methacrylate, 3-isocyanatopropyl acrylate, 3-isocyanatopropyl methacrylate, 4-isocyanatobutyl acrylate, 4-isocyanatobutyl methacrylate, and the like, and 2-isocyanatoethyl acrylate and 2-isocyanatoethyl methacrylate are particularly preferred.

The compound having an amino group and an alkoxysilyl group in the molecule is not particularly limited, but preferably has a structure represented by, for example, the general Formula (6).

[Chem 13]

$$NH_2-(CH_2)_s-Si(OR^{12})_3 \quad (6)$$

(wherein in the general Formula (6), $R^{12}$ is a methyl group or an ethyl group. s is an integer in of 1 to 10.)

Examples of the compound having an amino group and an alkoxysilyl group in the molecule include 2-aminoethyl trimethoxysilane, 2-aminoethyl triethoxysilane, 3-aminopropyl trimethoxysilane, 3-aminopropyl triethoxysilane, 4-aminobutyl trimethoxysilane, 4-aminobutyl triethoxysilane, and the like. Particularly, 3-aminopropyl trimethoxysilane, and 3-aminopropyl triethoxysilane are preferred.

By reacting such a compound having an isocyanate group and an acryl group in the molecule with such a compound having an amino group and a trialkoxysilyl group and subjecting them to a reaction of hydrolysis and condensation, the polyfunctional (meth)acryl group-containing silane condensate having a structure represented by the general Formula (1) and a structure represented by the general Formula (2-1) is obtained.

From the viewpoint of the prevention of the shrinkage and the loss of the pattern at the time of the thermal curing, the polyfunctional (meth)acryl group-containing silane condensate (B1) has preferably a weight average molecular weight of 1,000 or more, and more preferably of 2,000 or more. On the other hand, the weight average molecular weight of 20,000 or less is preferred from the viewpoint of the improvement of the solubility of the photosensitive resin composition of the present invention in an organic solvent, and the weight average molecular weight of 15,000 or less is more preferred.

The weight average molecular weight of the acryl group-containing silane condensate (B1) can be readily determined by measuring the weight average molecular weight (Mw) by gel permeation chromatography (GPC), a light scattering method, a small angle X-ray scattering method, or the like. The weight average molecular weight in the present invention is a value calculated based on the standard polystyrene in a GPC measurement.

The content ratio of the polyfunctional (meth)acryl group-containing silane condensate (B1) is preferably 25% by mass or more and 100% by mass or less, considering the total amount of the (meth)acryl group-containing compound (B) as 100% by mass. The content of 25% by mass or more is preferred from the viewpoint of the formation of a forward taper, and more preferably 30% by mass or more.

The (meth)acryl group-containing compound (B) preferably contains a polyfunctional (meth)acryl group-containing compound (B2) in addition to the polyfunctional (meth)acryl group-containing silane condensate (B1) in order to enhance the sensitivity. In terms of the chemical structure, the polyfunctional (meth)acryl group-containing silane condensate (B1) is included in the range of the polyfunctional (meth)acryl group-containing compound (B2), but according to the definition in the present invention, the polyfunctional (meth)acryl group-containing silane condensate (B1) is not included in the range of the polyfunctional (meth)acryl group-containing compound (B2).

Examples of the polyfunctional (meth)acryl group-containing compound (B2) are shown as below. Ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, trimethylolpropane diacrylate, trimethylolpropane triacrylate, trimethylolpropane dimethacrylate, trimethylolpropane trimethacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol dimethacrylate, 1,9-nonanediol dimethacrylate, 1,10-decanediol dimethacrylate, dimethylol-tricyclodecane diacrylate, pentaerythritol triacrylate, pentaerythritol trimethacrylate, pentaerythritol tetraacrylate, pentaerythritol tetramethacrylate, dipentaerythritol hexaacrylate, dipentaerythritol hexamethacrylate, 1,3-diacryloyloxy-2-hydroxypropane, 1,3-dimethacryloyloxy-2-hydroxypropane, N,N-methylenebisacrylamide, AH-600 (trade name, manufactured by Kyoeisha Chemical Co., Ltd.), AT-600 (trade name, manufactured by Kyoeisha Chemical Co., Ltd.), UA-306H (trade name, manufactured by Kyoeisha Chemical Co., Ltd.), UA-306T (trade name, manufactured by Kyoeisha Chemical Co., Ltd.), ethylene oxide modified bisphenol A diacrylate, ethylene oxide modified bisphenol A dimethacrylate. One kind of the polyfunctional (meth)acryl group-containing compound (B2) can be used alone, or two kinds or more thereof can be used in combination.

Among these, more preferred examples include 1,9-nonanediol dimethacrylate, 1,10-decanediol dimethacrylate, dimethylol-tricyclodecane diacrylate, pentaerythritol triacrylate, pentaerythritol trimethacrylate, pentaerythritol tetraacrylate, pentaerythritol tetramethacrylate, dipentaerythritol hexaacrylate, dipentaerythritol hexamethacrylate, N,N-methylenebisacrylamide, ethylene oxide modified bisphenol A diacrylate, ethylene oxide modified bisphenol A dimethacrylate, and the like.

Furthermore, (meth)acrylic acid esters of pentaerythritol represented by the following general Formulas (3) and (4) are particularly preferred. Examples thereof include pentaerythritol triacrylate, pentaerythritol trimethacrylate, pentaerythritol tetraacrylate, pentaerythritol tetramethacrylate and the like.

[Chem 14]

$$\left( \begin{array}{c} H_2C \\ \diagdown \\ R^4 \end{array} \begin{array}{c} O \\ \| \\ \end{array} O-CH_2 \right)_4 C \quad (3)$$

(wherein in the general Formula (3), $R^4$ is a hydrogen atom or a methyl group.)

[Chem 15]

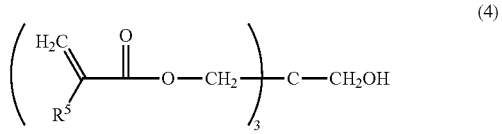

(4)

(wherein in the general Formula (4), $R^5$ is a hydrogen atom or a methyl group.)

Even when the (meth)acryl group-containing compound (B) only contains the polyfunctional (meth)acryl group-containing silane condensate acryl group-containing silane condensate (B1), it is possible to form a cross-sectional shape of a forward taper after curing. Nonetheless, when the contents of the polyfunctional (meth)acryl group-containing silane condensate (B1) and the polyfunctional (meth)acryl group-containing compound (B2) are at an appropriate ratio as described later, the photo cross-linking reaction progresses efficiently during the exposure, and thus the cross-sectional shape after curing can be formed into a forward taper with higher sensitivity.

In the present invention, with regards to the content ratio of the polyfunctional (meth)acryl group-containing silane condensate acryl group-containing silane condensate (B1) to the polyfunctional (meth)acryl group-containing compound (B2), the polyfunctional (meth)acryl group-containing compound (B2) is preferably 50 parts by mass to 300 parts by mass based on 100 parts by mass of the total amount of the polyfunctional (meth)acryl group-containing silane condensate (B1). The polyfunctional (meth)acryl group-containing compound (B2) of 50 parts by mass or more is preferred from the viewpoint of an efficient progress of the photo cross-linking reaction by the polyfunctional (meth)acryl group from the surface to the bottom of the exposed portion, and the polyfunctional (meth)acryl group-containing compound (B2) of 300 parts by mass or less is preferred because excessive development and the loss of the shape of the pattern during the thermal curing can be prevented.

As for the proportion of compounds which are contained in the polyfunctional (meth)acryl group-containing compound (B2) and are represented by the general Formula (3) and the general Formula (4), considering the total amount of the polyfunctional (meth)acryl group-containing compound (B2) as 100% by mass, the ratio of the total amount of the compounds represented by the general Formula (3) and the general Formula (4) is preferably 50% by mass or more and 100% by mass or less. The ratio of 50% by mass or more is preferred from the viewpoint of an efficient progress of the photo cross-linking reaction from the surface to the bottom of the exposed portion.

The photosensitive resin composition of the present invention can contain a photosensitizing agent. One example of such an agent includes a photopolymerization initiator (C).

Examples of photopolymerization initiators (C) are shown as follows.

Benzophenones such as benzophenone, Michler's ketone, 4,4,-bis(diethylamino)benzophenone, and 3,3,4,4,-tetra(t-butylperoxycarbonyl)benzophenone.

Benzylidenes such as 3,5-bis(diethylaminobenzylidene)-N-methyl-4-piperidine and 3,5-bis(diethylamino benzylidene)-N-ethyl-4-piperidine.

Coumarins such as 7-diethylamino-3-thenoylcoumarin, 4,6-dimethyl-3-ethyl amino coumarin, 3,3-carbonylbis(7-diethylamino coumarin), 7-diethylamino-3-(1-methylbenzimidazolyl)coumarin, and 3-(2-benzothiazolyl)-7-diethylamino coumarin.

Anthraquinones such as 2-t-butylanthraquinone, 2-ethylanthraquinone, and 1,2-benzanthraquinone.

Benzoins such as benzoin methyl ether, benzoin ethyl ether and benzoin isopropyl ether.

Mercaptos such as ethylene glycol di(3-mercaptopropionate), 2-mercaptobenzothiazole, 2-mercaptobenzoxazole, and 2-mercaptobenzimidazole.

Glycines such as N-phenylglycine, N-methyl-N-phenylglycine, N-ethyl-N-(p-chlorophenyl)glycine and N-(4-cyanophenyl)glycine.

Oximes such as 1-phenyl-1,2-butanedione-2-(o-methoxycarbonyl)oxime, 1-phenyl-1,2-propanedione-2-(o(methoxycarbonyl)oxime, 1-phenyl-1,2-propanedione-2-(o-ethoxycarbonyl)oxime, 1-phenyl-1,2-propanedione-2-(o-benzoyl)oxime, bis(A-isonitrosopropiophenoneoxime)isophthal, 1,2-octanedione-1-[4-(phenylthio)phenyl]-2-(o-benzoyloxime), OXE02 (trade name, manufactured by Ciba Specialty Chemicals Inc.), and NCI-831 (trade name, manufactured by ADEKA Corporation).

A-aminoalkylphenones such as 2-benzyl-2-dimethylamino-1-(4-morpholinophenyl)-butane-1-2-methyl-1[4-(methylthio)phenyl]-2-morpholinopropane-1-one, 2,2'-bis(o-chlorophenyl)-4,4',5,5'-tetraphenylbiimidazole, and the like.

Among these, the oximes as described above are preferred. More preferred examples include 1-phenyl-1,2-propanedione-2-(o-ethoxycarbonyl)oxime, 1-phenyl-1,2-propanedione-2-(o-benzoyl)oxime, bis(A-isonitrosopropiophenoneoxime)isophthal, 1,2-octanedione-1-[4-(phenylthio)phenyl]-2-(o-benzoyloxime), OXE02 and NCI-831. One of these can be used alone, or two kinds or more can be used in combination. The structures of OXE-02 and NCI-831 are shown by the following formulas.

[Chem 16]

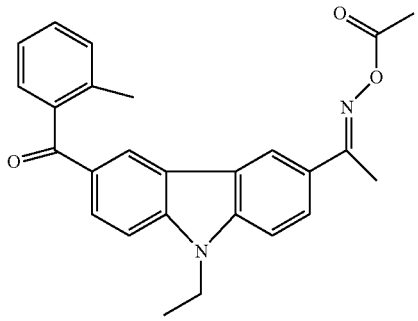

[Chem 17]

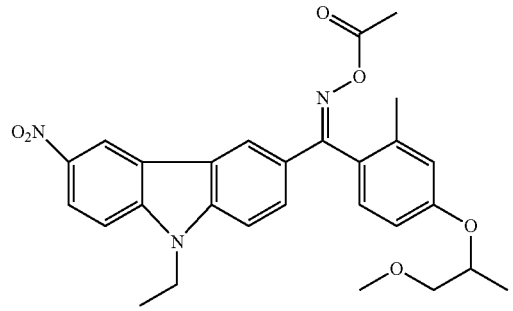

Among these, a combination selected from the above benzophenones, glycines, mercaptos, oximes, A-aminomethylphenones, and 2,2'-bis(o-chlorophenyl)-4,4',5,5'-tetraphenylbiimidazole is suitable from the viewpoint of photoreaction.

The content of the photopolymerization initiator (C) is, based on 100 parts by mass of the total amount of the alkali-soluble resin (A), preferably 0.1 to 60 parts by mass, and more preferably 0.2 to 40 parts by mass. The content of 0.1 parts by mass or more is preferred because radicals are generated sufficiently by light irradiation and the sensitivity is thus improved. When the content is 60 parts by mass or less, the alkali development performance is improved while the curing of the unirradiated portion due to the generation of excessive radicals does not occur.

The photosensitive resin composition of the present invention may also contain a thermal cross-linking agent (D). A thermal cross-linking agent (D) forms a cross-linking structure between the resins of (A) by a thermal treatment. Thus, the film properties after the thermal curing and the chemical resistance can be improved. In addition, the shrinkage ratio can be reduced. Examples of the thermal cross-linking agent (D) include a compound having a thermally cross-linkable group represented by the general Formula (7) and a benzoxazine compound.

[Chem 18]

(wherein in the general Formula (7), $R^{13}$ is a hydrogen atom, a $C_1$-$C_{20}$ alkyl group or a $C_4$-$C_{20}$ alicyclic hydrocarbon group.

Examples of the thermal cross-linking agent (D) include, as those having one cross-linkable group, ML-26X, ML-24X, ML-236TMP, 4-methylol3M6C, ML-MC, ML-TBC (all of them are trade names, manufactured by Honshu Chemical Industry Co., Ltd.), P-a type benzoxazine (trade name, manufactured by Shikoku Chemicals Corporation) and the like, as those having two cross-linkable groups, DM-BI25X-F, 46DMOC, 46DMOIPP, 46DMOEP (all of them are trade names, manufactured by ASAHI YUKIZAI CORPORATION), DMLMBPC, DML-MBOC, DML-OCHP, DML-PC, DML-PCHP, DML-PTBP, DML-34X, DML-EP, DML-POP, DML-OC, dimethylol-Bis-C, dimethylol-BisOC-P, DML-BisOC-Z, DML-BisOCHP-Z, DML-PFP, DML-PSBP, DML-MB25, DML-MTrisPC, DML-Bis25X-34XL, DML-Bis25X-PCHP (all of them are trade names, manufactured by Honshu Chemical Industry Co., Ltd.), "NIKALAC (registered trademark)" MX-290 (trade name, manufactured by SANWA CHEMICAL CO., LTD.), B-a type benzoxazine, B-m type benzoxazine (all of them are trade names, manufactured by Shikoku Chemicals Corporation), 2,6-dimethoxymethyl-4-t-butylphenol, 2,6-dimethoxymethyl-p-cresol, 2,6-diacetoxymethyl-p-cresol and the like, as those having three cross-linkable groups, TriML-P, TriML-35XL, TriML-TrisCR-HAP (all of them are trade names, manufactured by Honshu Chemical Industry Co., Ltd.) and the like, as those having four cross-linkable groups, TM-BIP-A (trade name, manufactured by ASAHI YUKIZAI CORPORATION), TML-BP, TML-HQ, TML-pp-BPF, TML-BPA, TMOM-BP (all of them are trade names, manufactured by Honshu Chemical Industry Co., Ltd.), "NIKALAC" (registered trademark) MX-280, "NIKALAC" (registered trademark) MX-270 (all of them are trade names, manufactured by SANWA CHEMICAL CO., LTD.) and the like, and as those having six cross-linkable groups, HML-TPPHBA, HML-TPHAP, HMOM-TPPHBA, HMOM-TPHAP (all of them are trade names, manufactured by Honshu Chemical Industry Co., Ltd.), "NIKALAC" (registered trademark) MW-390, "NIKALAC" (registered trademark) MW-100LM (all of them are trade names, manufactured by SANWA CHEMICAL CO., LTD.).

Among these, because the cross-linking density of the cured film becomes higher and the chemical resistance enhances more, those having two or more cross-linkable groups are preferred, those containing 4 or more cross-linkable groups are more preferred, and those containing 6 or more cross-linkable groups are further preferred.

Among these thermal cross-linking agents (D), for example, the compounds having a methylol group or a methylol group in which a hydrogen atom of the alcoholic hydroxyl group is substituted undergo cross-linking by a reaction mechanism in which these functional groups are directly added to a benzene ring.

Structures of representative thermal cross-linking agents (D) which are particularly preferably used in the photosensitive resin composition of the present invention is shown below.

[Chem 19]

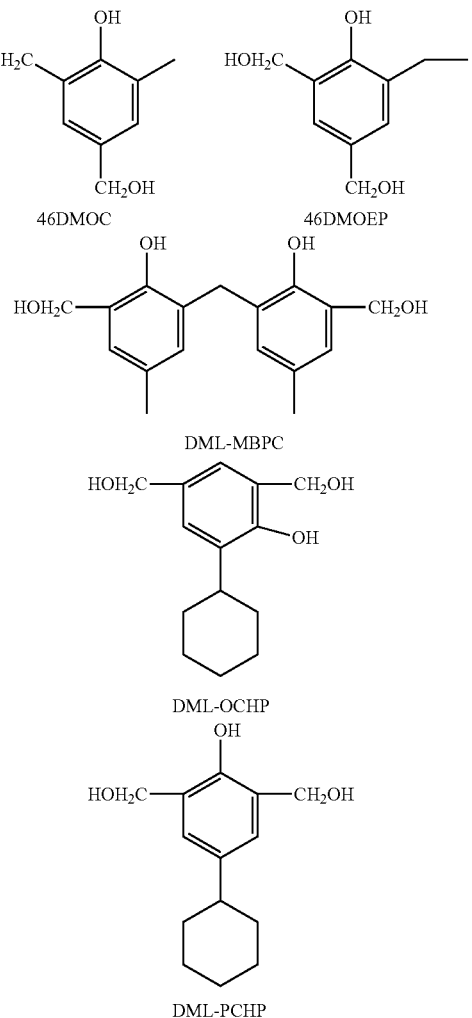

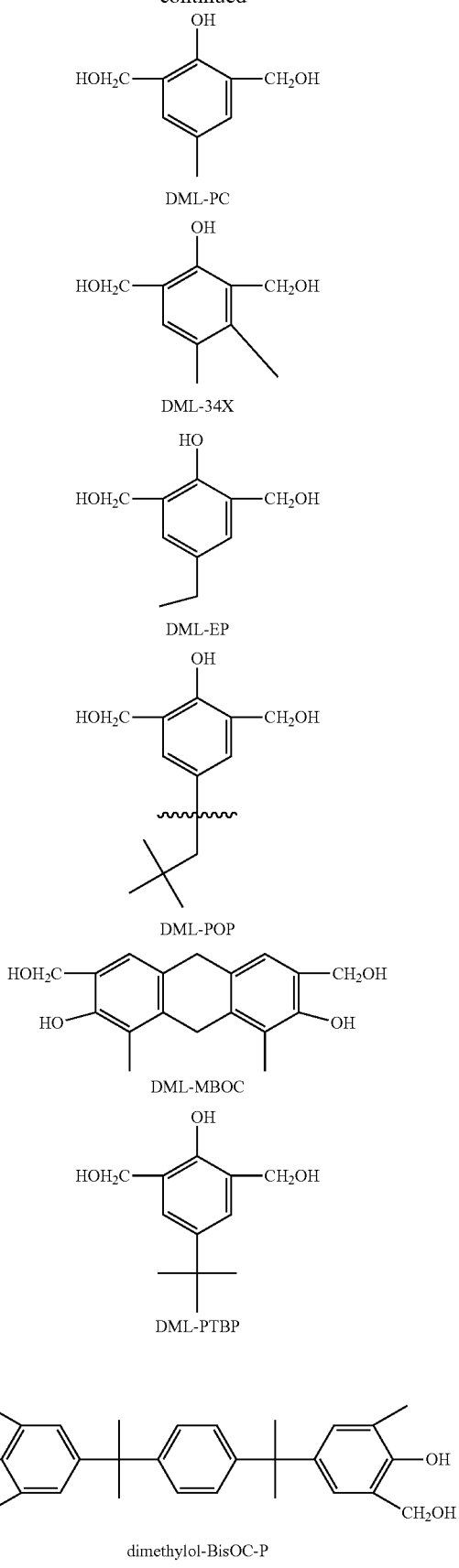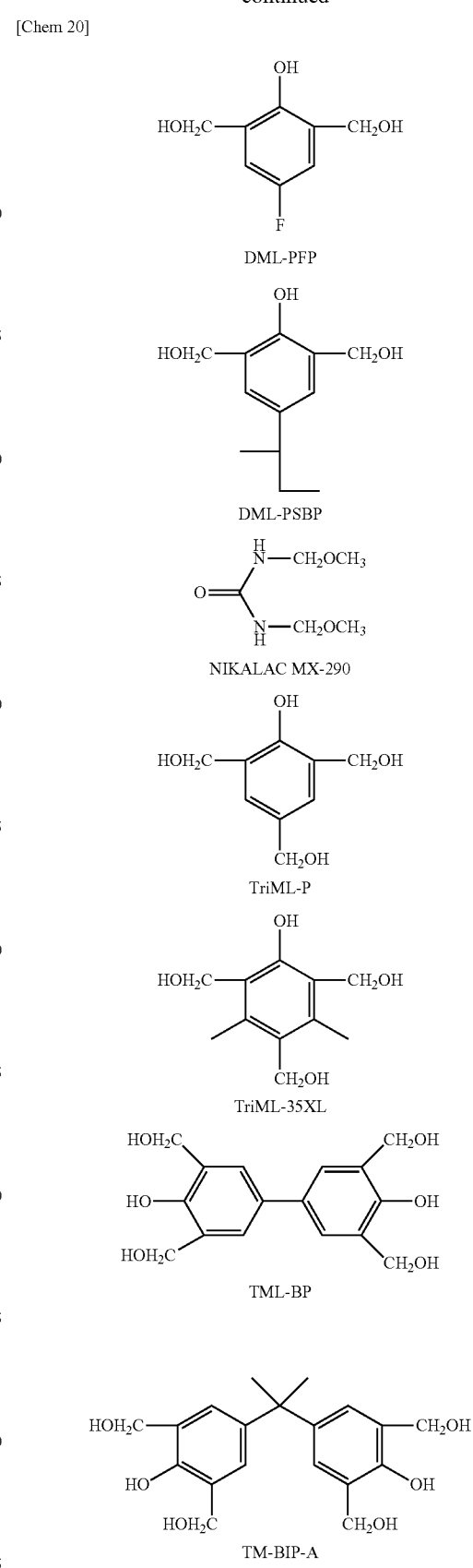

-continued

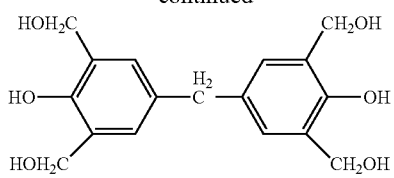
TM-pp-BPF

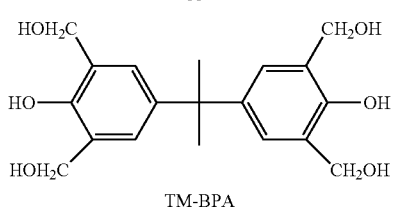
TM-BPA

[Chem 21]

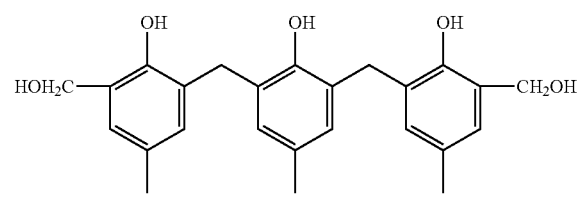
DML-MTrisPC

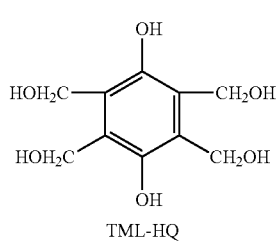
TML-HQ

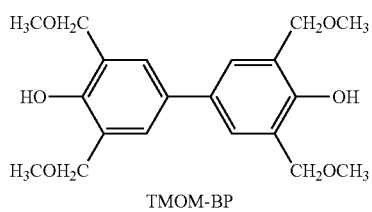
TMOM-BP

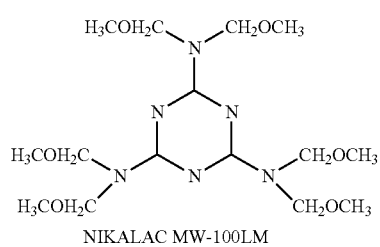
NIKALAC MW-100LM

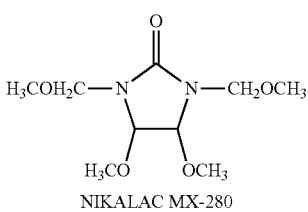
NIKALAC MX-280

-continued

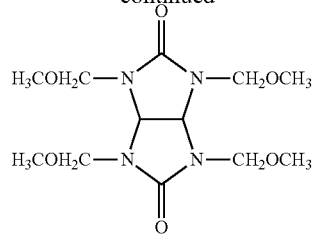
NIKALAC MX-270

One of these thermal cross-linking agents (D) can be used alone, or two kinds or more can be used in combination.

The content of the thermal cross-linking agent (D) is, based on 100 parts by mass of the total amount of (A) the alkali-soluble resin (A), preferably 0.5 parts by mass or more, more preferably 1 parts by mass or more, further preferably 3 parts by mass or more, particularly preferably 5 parts by mass or more, and preferably 150 parts by mass or less, and particularly preferably 130 parts by mass or less. When the content of the thermal cross-linking agent (D) is 150 parts by mass or less with regard to 100 parts by mass of (A) the alkali-soluble resin (A), the thermal treatment of the film of the photosensitive resin composition does not cause the reduction of heat resistance of the resulting film. On the other hand, when the content is 0.5 parts by mass or more, the heat resistance of the film obtained from the heat resistant resin composition is improved due to the effect of the increased molecular weight by sufficient cross-linking.

The photosensitive resin composition of the present invention can further contain a sensitizer (E). In particular, the use of a thioxanthone compound can sensitize the photopolymerization initiator (C) efficiently and the sensitivity is further improved.

Preferred examples of thioxanthone compounds include thioxanthone, 2-methylthioxanthone, 2-ethylthioxanthone, 2-propylthioxanthone, 4-methylthioxanthone, 4-ethylthioxanthone, 4-propylthioxanthone, 2-methyl-4-ethyl thioxanthone, 2-ethyl-4-propylthioxanthone, 2-ethyl-4-methylthioxanthone, 2-ethyl-4-propylthioxanthone, 2-propyl-4-methylthioxanthone, 2-propyl-4-ethylthioxanthone, 2,4-dimethylthioxanthone, 2,4-diethylthioxanthone, 2,4-dipropylthioxanthone and the like.

The content of the sensitizer (E) is, based on 100 parts by mass of the total amount of the alkali-soluble resin (A), preferably 0.01 parts by mass or more, and particularly preferably 0.05 parts by mass or more from the viewpoint of the improvement of the sensitivity. Moreover, because the alkali development performance is improved while the curing of the unirradiated portion due to excessive sensitization effect does not occur, the content is preferably 10 parts by mass or less, and particularly preferably 5 parts by mass or less.

For the purpose of adjusting the alkali development performance of the photosensitive resin composition of the present invention, a compound having a phenolic hydroxyl group can be contained.

Examples of compounds having a phenolic hydroxyl group which can be used in the present invention include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, BisRS-OCHP (all of them are trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A (all of them are trade names, manufactured by ASAHI YUKIZAI CORPORATION).

A structure of a representative compound having a phenolic hydroxyl group which is preferably used in the photosensitive resin composition of the present invention is shown below.

[Chem 22]

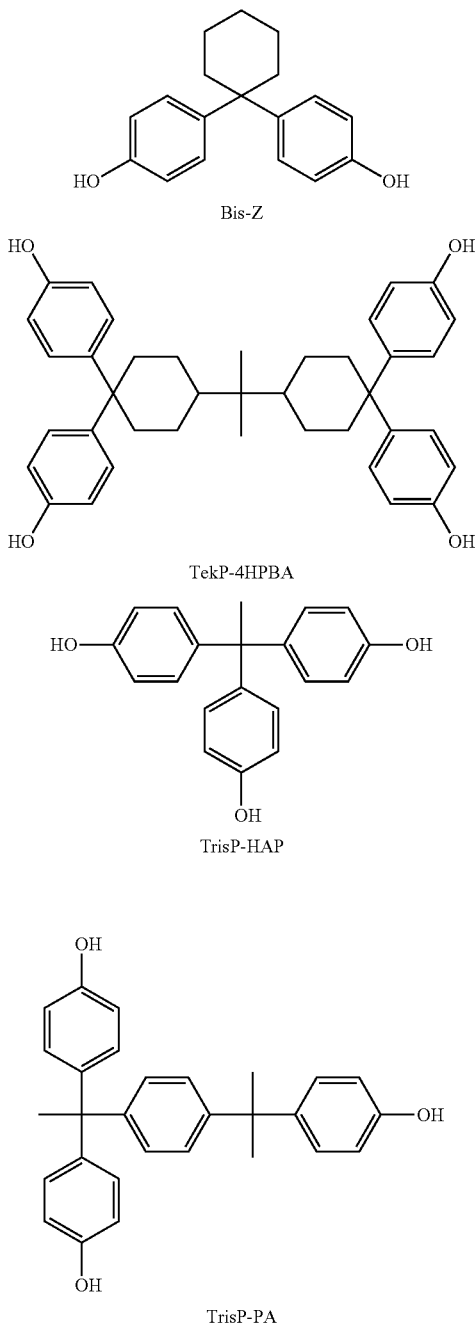

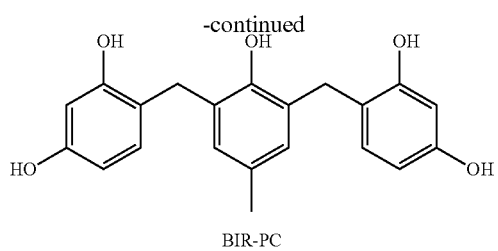

When the photosensitive resin composition contains this compound having a phenolic hydroxyl group, the resulting resin composition has an unexposed portion which is easily dissolved in the alkali developing solution and an exposed portion which is hardly soluble in the alkali developing solution. As a result, the development in a short time is possible, and the film reduction by the developing solution is lessened.

The content of the compound having a phenolic hydroxyl group is, based on 100 parts by mass of the total amount of the alkali-soluble resin (A), preferably in a range of 1 to 60 parts by mass, and further preferably in a range of 3 to 50 parts by mass.

The heat resistant resin composition of the present invention may contain an adherence improving agent. Examples of adherence improving agents include alkoxysilane-containing compounds, and the like. Two kinds or more of these can be contained. When these compounds are contained, the adherence property between the film and the substrate after burning or after curing can be improved.

Specific examples of alkoxysilane-containing compounds are shown below.

N-phenylaminoethyl trimethoxysilane, N-phenylaminoethyl triethoxysilane, N-phenylaminopropyl trimethoxysilane, N-phenylaminopropyl triethoxysilane, N-phenylaminobutyl trimethoxysilane, N-phenylaminobutyl triethoxysilane, vinyltrimethoxysilane, vinyltriethoxysilane, 3-glycidoxypropyl trimethoxy silane, 3-glycidoxypropyl triethoxysilane, p-styryl trimethoxysilane, 3-aminopropyl trimethoxysilane, 3-aminopropyl triethoxysilane, 3-methacryloxypropyl trimethoxysilane, 3-methacryloxypropyl triethoxysilane, 3-acryloxypropyl trimethoxysilane, 3-aminopropyl trimethoxysilane, 3-aminopropyl triethoxysilane, vinyltrichlorosilane, vinyltris(B-methoxyethoxy)silane and the like.

The total content of the adherence improving agent is, based on 100 parts by mass of the alkali-soluble resin (A), preferably 0.01 to 15 parts by mass. The content of 0.01 parts by mass or more is preferred because the adherence property between the film and the substrate after burning or after curing can be improved. The content of 15 parts by mass or less is preferred because the adherence property is improved while the alkali development performance is not decreased due to excessive adherence.

The heat resistant resin composition of the present invention may contain a surfactant, thereby improving the wettability with the substrate.

Examples of surfactants are shown below.

Fluorosurfactants such as "FLUORAD" (registered trademark) (manufactured by 3M Japan Limited), "Megaface" (registered trademark) (manufactured by DIC Corporation), and "Surflon" (registered trademark) (manufactured by Asahi Glass Co., Ltd.).

Organic siloxane surfactants such as KP341 (trade name, manufactured by Shin-Etsu Chemical Co., Ltd.), DBE (trade name, manufactured by Chisso Corporation), Granol (trade name, manufactured by Kyoeisha Chemical Co., Ltd.), and "BYK" (registered trademark) (manufactured by BYK KK). Acrylic polymer surfactants such as POLYFLOW (trade name, manufactured by Kyoeisha Chemical Co., Ltd.).

The photosensitive resin composition of the present invention is dissolved or dispersed in an organic solvent for use. Organic solvents having a boiling point of 80° C. to 250° C. under atmospheric pressure are preferably used.

Examples of organic solvents preferably used in the present invention are shown below. Ethers such as ethylene glycol monomethyl ether, ethylene glycol monoethyl ether, propylene glycol monomethyl ether, propylene glycol monoethyl ether, ethylene glycol dimethylether, ethylene glycol diethylether, and ethylene glycol dibutyl ether.

Acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate.

Ketones such as acetylacetone, methylpropyl ketone, methylbutyl ketone, methylisobutyl ketone, cyclopentanone, and 2-heptanone. Alcohols such as butyl alcohol, isobutyl alcohol, pentanol, 4-methyl-2-pentanol, 3-methyl-2-butanol, 3-methyl-3-methoxybutanol, and diacetone alcohol.

Aromatic hydrocarbons such as toluene and xylene.

N-methyl-2-pyrrolidone, N-cyclohexyl-2-pyrrolidone, N,N-dimethylformamide, N,N-dimethylacetamide, dimethylsulfoxide, γ-butyrolactone, 1,3-dimethyl-2-imidazolidinone, N,N-dimethyl propylene urea, 3-methoxy-N,N-dimethylpropionamide, delta valerolactone and the like.

One of these can be used alone, or two kinds or more can be used.

Among these, those who dissolve the alkali-soluble resin (A) and have a boiling point of 100° C. to 210° C. under atmospheric pressure are particularly preferred. With the boiling point in this range, when a solution or dispersion of the photosensitive resin composition is applied, there is no possibility that the solution or dispersion solution cannot be applied due to excessive volatilization of the organic solvent, and it is not necessary to increase the temperature of the thermal treatment of the composition. Therefore, there is no restriction on the material of the base substrate. Further, by using an organic solvent which dissolves the alkali-soluble resin (A), a uniformly coated film can be formed on the underlying substrate.

Particularly preferred organic solvents having such a boiling point are shown as follows. Cyclopentanone, ethylene glycol monomethyl ether, ethylene glycol monoethyl ether, propylene glycol monomethyl ether, methyl lactate, ethyl lactate, diacetone alcohol, 3-methyl-3-methoxy butanol, gamma butyrolactone, N-methyl-2-pyrrolidone.

The organic solvent used in the photosensitive resin composition of the present invention is, based on 100 parts by mass of the total amount of the alkali-soluble resin (A), preferably 20 parts by mass or more, particularly preferably 30 parts by mass or more, and preferably 800 parts by mass or less, particularly preferably 500 parts by mass or less.

The method of producing the photosensitive resin composition of the present invention will be explained. For example, the components (A) to (C), and the component (D) and/or the component (E) as necessary, a dissolution adjusting agent, an adhesion improvement agent, an adherence improving agent, a surfactant and the like can be dissolved in an organic solvent to obtain a solution of a photosensitive resin composition. Examples of methods for dissolution include stirring and heating. In the case of heating, the heating temperature is preferably set within a range which does not impair the performance of the photosensitive resin composition, and is usually from room temperature to 80° C. The order of dissolving each component is not particularly limited, and for example, there is a method of dissolving sequentially compounds in ascending order of the solubility. With respect to a component which tends to generate air bubbles at the time of stirring and dissolution, such as a surfactant and a part of adhesion improving agents, such a component can be added in the end after dissolving other components to prevent poor dissolution of other components due to the generation of air bubbles.

It is preferable that the resulting solution of the photosensitive resin composition is filtered using a filtration filter to remove dust and particles. The filer pore diameter is, for example, 0.5 μm, 0.2 μm, 0.1 μm, 0.07 μm, 0.05 μm, 0.03 μm, 0.02 μm, 0.01 μm, 0.005 μm or the like, but not limited thereto. Materials for the filtration filter include polypropylene, polyethylene, nylon, polytetrafluoroethylene (PTFE) and the like, but polyethylene and nylon are preferred.

The method of producing a film of the photosensitive resin composition of the present invention is explained by way of examples.

First of all, the solution of the photosensitive resin composition is coated on a substrate. As the substrate, a silicon wafer, a ceramic, gallium arsenide or the like can be used, but it is not limited thereto. The substrate may be pretreated with a compound such as a silane coupling agent or a titanium chelating agent. For example, a surface treatment is performed by spin-coating, dipping or splay-coating and then drying a solution obtained by dissolving 0.5 to 20% by mass of the above coupling agent in a solvent such as isopropanol, ethanol, methanol, water, tetrahydrofuran, propylene glycol monomethyl ether acetate, propylene glycol monomethyl ether, ethyl lactate, diethyl adipate or the like. The surface treatment may be also performed by bringing the above compound for the surface treatment into contact. In some cases, the reaction between the substrate and the above coupling agent or the like can be proceeded by applying a temperature of 50° C. to 300° C. afterwards.

Examples of methods of applying the solution of the photosensitive resin composition include methods such as spin coating using a spinner, spray coating, roll coating and the like. Usually, the film thickness of the coated film after drying is 1 to 50 μm.

Then, the substrate with the solution of the photosensitive resin composition coated thereon is heated to obtain a film of the photosensitive resin composition. This step is also called prebaking. Drying is preferably carried out at a temperature in the range of 70 to 140° C. for 1 minute to several hours, using an oven, a hot plate, infrared rays or the like. In the case of using a hot plate, the film is held on a plate directly or a jig such as a proximity pin installed on the plate and then heated. Examples of materials of the proximity pin include metallic materials such as aluminum and stainless steel, and synthetic resins such as polyimide resins and "Teflon" (registered trademark). A proximity pin of any material can be used as long as it is heat resistant. The height of the proximity pin varies depending on the size of the substrate, the kind of the film, the purpose of heating, or the like, but is preferably 0.1 to 10 mm.

Then, this film of the photosensitive resin composition is irradiated with actinic rays through a mask having a desired pattern and thus exposed to light. Instead of using a mask, a very thin beam may be swept to expose the film of the photosensitive resin composition to light. The actinic rays used for the exposure include ultraviolet rays, visible light rays, electron beams, X-rays and the like. In the present invention, the i-line (365 nm), h-line (405 nm) or g-line (436 nm) of a mercury-vapor lamp is preferred.

If necessary, a baking treatment after the exposure is then performed. The temperature for this is preferably in the range of 50 to 180° C., and more preferably in the range of 60 to 150° C. The duration is not particularly limited, but preferably from 10 seconds to several hours from the viewpoint of the development performance after that.

After the exposure, in order to form a film pattern of the photosensitive resin composition, an unexposed portion is removed using a developing solution. The developing solution is preferably an aqueous solution of an alkaline compound such as tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, hexamethylenediamine, or the like.

In some cases, at least one kind of polar solvents such as N-methyl-2-pyrrolidone, N,N-dimethylformamide, N,N-dimethylacetamide, dimethylsulfoxide, γ-butyrolactone and dimethylacrylamide, alcohols such as methanol, ethanol and isopropanol, esters such as ethyl lactate and propylene glycol monomethyl ether acetate, ketones such as cyclopentanone, cyclohexanone, isobutyl ketone, and methyl isobutyl ketone, and the like may be added to this aqueous alkali solution.

It is common to rinse with water after development. For rinsing, at least one kind of alcohols such as ethanol and isopropyl alcohol; esters such as ethyl lactate, propylene glycol monomethylether acetate, and 3-methoxy methyl propanoate may be added to the water.

A pattern of the film is obtained by the development. This is heated at a temperature in the range of 150 to 500° C. to cure the film of the photosensitive resin and convert the pattern of the film into a cured relief pattern. This heat treatment is preferably carried out for 5 minutes to 5 hours by choosing temperatures and increasing the temperature stepwise or choosing a temperature range and continuously increasing the temperature. Examples include a method of thermal treatment at 130° C., 200° C., and 350° C. for 30 minutes for each, a method of linearly raising the temperature from room temperature to 320° C. for 2 hours, and the like.

The resulting cured relief pattern is used suitably for the application such as a passivation film of a semiconductor component, an interlayer insulating film of a thin film inductor or a multilayer wiring for high density mounting, an insulating layer of an organic electroluminescent device, or the like.

An application example into an electronic component having a coil conductor in which the heat resistant resin composition of the present invention is used is explained with reference to FIG. 1. FIG. 1 shows a diagram of a cross section of an electronic component having a coil conductor of the present invention, in which a multi-layer structure portion formed by laminating insulating layers and coil conductor layers alternately is enlarged. The insulating film 2a resulting from the heat resistant resin composition of the present invention is formed on the substrate 1, and on this insulating film 2a, the coil conductor layer 3a is formed. Likewise, the coil conductor layers 3b to 3d corresponding to the insulating films 2b to 2d are formed, and the insulating films 2e and 2f are formed. The role required in an insulating film is, in addition to the insulation between the coil conductor patterns, the formation of the cross-sectional shape of the through-hole portions 4a and 4b into a forward taper, resulting in a good formation of a seed layer before a plating treatment and the plating after that, and thus reduction of the incidence rate of poor electrical connection. The photosensitive resin composition of the present invention can be suitably used for this purpose.

EXAMPLES

The present invention is explained below by way of Examples, but the present invention is not limited to these Examples. The evaluation of the photosensitive resin composition in Examples was performed in the following methods.

<Production of a Photosensitive Resin-Coated Film>

A solution of a photosensitive resin composition (hereinafter referred to as "varnish") is applied on an 8-inch silicon wafer so that the film thickness after the prebaking will be 12 μm. Then, a wafer was placed on a hot plate (ACT-8 manufactured by Tokyo Electron Ltd) and prebaked at 120° C. for 3 minutes to obtain a film of a photosensitive resin composition.

<Method of Measuring the Film Thickness>

The measurement was carried out using Lambda Ace STM-602J manufactured by Dainippon Screen Mfg. Co., Ltd., with a value of refractive index of the polyimide set to 1.63.

<Exposure>

A reticle having a pattern was set on an exposure apparatus (i-line stepper NSR-2005i9C manufactured by NIKON CORPORATION), and a pattern exposure was performed on the prebaked photosensitive resin film at an exposure amount of 500 mJ/cm$^2$.

<Baking After the Exposure>

The film of the exposed photosensitive resin was thermally treated at 120° C. for 1 minute using a hot plate (ACT-8 manufactured by Tokyo Electron Ltd).

<Development>

Using a developing apparatus, ACT-8 manufactured by Tokyo Electron Ltd, a 2.38% aqueous solution of tetramethylammonium hydroxide was discharged for 10 seconds on the film of the photosensitive resin which had been baked after the exposure while the substrate with the film placed thereon was rotated at 50 rpm. After that, the substrate with the film placed thereon was allowed to stand still at 0 rpm for 30 seconds, rinsed with purified water at 500 rpm, and dried by shaking at 3000 rpm for 10 seconds to obtain a coated film after the development.

<Thermal Curing>

The development film was thermally treated under a nitrogen gas flow (oxygen concentration of 20 ppm or less) at a temperature raised from 50° C. to the curing temperature of 280° C. over 60 minutes, and at 280° C. for 60 minutes, using an inert oven INH-21CD (manufactured by Koyo Thermo Systems Co., Ltd.). After that, the inside of the oven was gradually cooled until it reached 50° C. or less, and a cured film having a cured relief pattern was thus obtained.

<Evaluation of the Cross-Sectional Shape of the Cured Relief Pattern>

The silicon wafer obtained by the above method was fractured perpendicularly to the wafer surface along with the cured film. Using a field emission scanning electron microscope (S-4800 manufactured by Hitachi High-Technologies Corporation), the cross-sectional shape of an opening portion of 10 μm or more and 20 μm or less in the cured relief pattern was observed to measure the angle of the taper. The measured angle of the taper corresponds to the part described as the angle of the taper 24 in FIG. 2. The taper angle of the cross section of the pattern is preferably 45° or more and less than 90°, and further preferably 75° or more and less than 90°. In the evaluation of the cross-sectional shape of the pattern, the taper angle of 75° or more and less than 90° was evaluated as 4, the taper angle of 60° or more and less than 75° was evaluated ad 3, the taper angle of 45° or more and less than 60° was evaluated as 2, and the taper angle of less than 45° or more than 90° was evaluated as 1.

<Evaluation of Chemical Resistance>

Regarding the varnishes described in each Example and Comparative Example, the cured relief pattern produced on the silicon wafer in the method as explained above was subjected to a dipping treatment in "Stripping solution 106" manufactured by TOKYO OHKA KOGYO CO., LTD. at 40° C. for 30 minutes. The film thickness before and after the treatment was measured to obtain the variation of the film thickness. Furthermore, the presence or absence of cracks or peeling was observed with an optical microscope. The variation of the film thickness is preferably less than 3%, and more preferably less than 1%. For the evaluation of the chemical resistance, the variation of the film thickness of 0 to less than 1% was evaluated as 3, the variation of the film thickness of 1 to less than 3% was evaluated as 2, and the variation of the film thickness of 3% or more was evaluated as 1. In the evaluation of cracks and peeling, it was rated as good when cracks and peeling were not observed, and poor when cracks or peeling were observed.

<Evaluation of Electrical Insulation Property>

Regarding the varnishes described in each Example and Comparative Example, the entire surface of the film of the photosensitive resin prepared on the silicon wafer in the method as described above was exposed to light without using a reticle, then thermally cured without being developed. A cured film was thus obtained. This cured film was immersed in 47% hydrofluoric acid at room temperature for 3 minutes, washed with tap water, and the cured film was peeled from the silicon wafer. On the cured film which was thus peeled off, a withstanding voltage/insulation resistance tester TOS9201 manufactured by KIKUSUI ELECTRONICS CORPORATION was used to increase the voltage with a DCW at a boosting rate of 0.1 kV/1 second, and the voltage was measured when the insulation breakdown occurred. The obtained voltage was divided by the film thickness to determine the insulation breakdown voltage per unit of the film thickness. The insulation breakdown voltage per 1 mm of the film thickness, which was obtained by the calculation, of 400 kV or more was evaluated as 3, the insulation breakdown voltage of 300 kV or more and less than 400 kV was evaluated as 2, and the insulation breakdown voltage of less than 300 kV was evaluated as 1.

<Evaluation of the Weight Average Molecular Weight>

The weight average molecular weight of the (meth)acryl group-containing silane condensate (B1) was measured using a GPC apparatus HLC-8220 (manufactured by Tosoh Corporation), and two columns of TSK-gel SuperHM-H, manufactured by Tosoh Corporation and one column of TSK-gel SuperH 2000, manufactured by Tosoh Corporation, which were connected in series. The eluent was tetrahydrofuran, the flow rate was 0.4 mL/min, and the measurement temperature was 40° C. Thus, the weight average molecular weight was calculated based on polystyrene.

<Abbreviations of Raw Materials>

In the following Examples, raw materials are abbreviated in some cases.

Abbreviations are as follows.

PBO precursor: The polybenzoxazal precursor of Synthesis Example 4
PET 4A: Pentaerythritol tetraacrylate
PET 3A: pentaerythritol triacrylate
DPHA: dipentaerythritol hexaacrylate
NCI-831: "ADEKA ARKLS" (registered trademark) NCI-831 (manufactured by ADEKA Corporation)
MX-270: "NIKALAC" (registered trademark) MX-270,
KBM-403: 3-glycidoxypropyl triethoxysilane, KBM-403,
PF77: POLYFLOW No. 77,
GBL: γ-butyrolactone
EL: ethyl lactate.

Compound Names of Synthesis Examples

The names of the compounds of Synthesis Examples 5 to 8 are abbreviated as follows.

P-AK: The precursor of the polyfunctional (meth)acryl group-containing silane condensate of Synthesis Example 5
AK: The polyfunctional (meth)acryl group-containing silane condensate of Synthesis Example 6
MK: The polyfunctional (meth)acryl group-containing silane condensate of Synthesis Example 7
NOV: The novolac resin of Synthesis Example 8.

<Synthesis Example 1>Synthesis of a Polyimide

Under dry nitrogen gas flow, 32.9 g (0.09 mol) of 2,2-bis(3-amino-4-hydroxyphenyl)hexafluoropropane (manufactured by Central Glass Co., Ltd., BAHF) was dissolved in 500 g of N-methylpyrrolidone (hereinafter, NMP). To this mixture, 31.0 g (0.1 mol) of 3,3',4,4'-diphenylether tetracarboxylic dianhydride (hereinafter, ODPA) was added with 50 g of NMP, and the resulting mixture was stirred at 30° C. for 2 hours. After that, 2.18 g (0.02 mol) of 3-aminophenol (manufactured by Tokyo Chemical Industry Co., Ltd.) was added, and the resulting mixture was stirred at 40° C. for 2 hours. Furthermore, 5 g of pyridine (manufactured by Tokyo Chemical Industry Co., Ltd.) was diluted with toluene (manufactured by Tokyo Chemical Industry Co., Ltd., 30 g), and added to the solution. Then a condenser tube was installed. The resulting mixture was allowed to react at the solution temperature of 120° C. for 2 hours, and further at 180° C. for 2 hours while the water and toluene were removed azeotropically outside the system. The temperature of this solution was lowered to a room temperature, and the solution was poured into 3 L of water to obtain white powder. This powder was collected by filtration and washed with water 3 times. After washing, the white powder was dried in a vacuum drier at 50° C. for 72 hours to obtain a polyimide.

<Synthesis Example 2>Synthesis of Hydroxyl Group-Containing Diamine Compound (HFHA)

First, 18.3 g (0.05 mol) of 2,2-bis(3-amino-4-hydroxyphenyl)hexafluoropropane (manufactured by Central Glass Co., Ltd., BAHF) was dissolved in 100 mL of acetone and 17.4 g (0.3 mol) of propylene oxide (manufactured by Tokyo Chemical Industry Co., Ltd.), and cooled to −15° C. To this mixture, a solution obtained by dissolving 20.4 g (0.11 mol) of 3-nitrobenzoyl chloride (manufactured by Tokyo Chemical Industry Co., Ltd.) in 100 mL of acetone was added dropwise. After the dropwise addition, the resulting mixture was stirred at −15° C. for 4 hours, and then the temperature was allowed to return to a room temperature. The precipitated white solid was filtered and vacuum-dried at 50° C.

Then, 30 g of the resulting white solid was put in a 300-mL stainless steel autoclave, and dispersed in 250 mL of methyl cellosolve, and 2 g of 5% palladium-carbon (manufactured by Wako Pure Chemical Corporation) was added. Hydrogen was introduced by a balloon to perform a reduction reaction at a room temperature. About 2 hours later, the reaction was ended as it was confirmed that the balloon would not deflate anymore. After the reaction ended, the palladium compound which was a catalyst was removed by filtration, and the mixture was concentrated in a rotary evaporator to obtain a hydroxyl group-containing diamine compound (HFHA) represented by the following Formula.

[Chem 23]

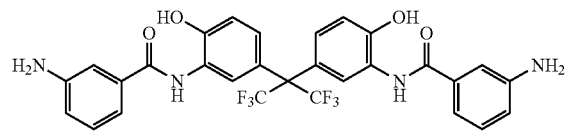

<Synthesis Example 3>Synthesis of a Polyimide Precursor

Under dry nitrogen gas flow, 51.3 g (0.085 mol) of HFHA obtained from Synthesis Example 1, 1.24 g (0.005 mol) of 1,3-bis(3-aminopropyl)tetramethyldisiloxane (SiDA, manufactured by Shin-Etsu Chemical Co., Ltd.), and 2.18 g (0.02 mol) of 3-aminophenol (manufactured by Tokyo Chemical Industry Co., Ltd.) were dissolved in 200 g of N-methyl-2-pyrrolidone (NMP). To this mixture, 31.0 g (0.1 mol) of 3,3',4,4'-diphenylether tetracarboxylic dianhydride (ODPA, Manac Incorporated) was added, and the resulting mixture was stirred at 40° C. for 2 hours. After that, a solution obtained by diluting 7.14 g (0.06 mol) of dimethylformamide dimethyl acetal (manufactured by MITSUBISHI RAYON CO., LTD., DFA) with 5 g of NMP was added dropwise over 10 minutes. After the dropwise addition, the resulting mixture was stirred at 40° C. for 2 hours. After the stirring ended, the solution was poured into 2 L of water, and a precipitate of a polymer solid was collected by filtration. The collected polymer solid was washed with 2 L of water 3 times and dried in a vacuum drier at 50° C. for 72 hours to obtain a polyimide precursor.

<Synthesis Example 4>Synthesis of a Polybenzoxazole Precursor

Under a dry nitrogen gas flow, 18.3 g (0.05 mol) of BAHF was dissolved in 50 g of NMP and 26.4 g (0.3 mol) of glycidyl methyl ether, and the temperature of the solution was decreased to −15° C. To this solution, a solution obtained by dissolving 7.4 g (0.025 mol) of diphenylether dicarboxylic acid dichloride (manufactured by NIHON NOHYAKU CO., LTD.) and 5.1 g (0.025 mol) of isophthalic acid chloride (manufactured by Tokyo Chemical Industry Co., Ltd.) in 25 g of γ-butyrolactone was added dropwise in a way that the temperature inside would not exceed 0° C. After the dropwise addition ended, the resulting mixture was stirred at −15° C. for 6 hours. After the reaction ended, the solution was poured into 3 L of water containing 10% by mass of methanol to obtain a white precipitate. This precipitate was collected by filtration, and washed with water 3 times, and dried in a vacuum drier at 50° C. for 72 hours to obtain a polybenzoxazole precursor.

<Synthesis Example 5>Synthesis of a Precursor of the Polyfunctional (Meth)Acryl Group-Containing Silane Condensate P-AK To a 1-L four-necked flask equipped with a stirrer, a thermometer, a dropping funnel and a reflux condenser tube was added 89.65 g (0.50 mol) of 3-aminopropyl trimethoxysilane (manufactured by Shin-Etsu Chemical Co., Ltd., KBM-903). In an ice bath, 70.60 g (0.50 mol) of 2-isocyanatoethyl acrylate (manufactured by Showa Denko K.K., "Karenz" (registered trademark) AOI) was added dropwise slowly using the dropping funnel, and then mixture was allowed to react at 40° C. for 8 hours. The reaction was terminated as the disappearance of the absorption of the isocyanate group was confirmed in infrared spectroscopy. The resulting mixture was cooled down to a room temperature, and the compound represented by the following Formula was obtained. The molecular weight was 320.41.

[Chem 24]

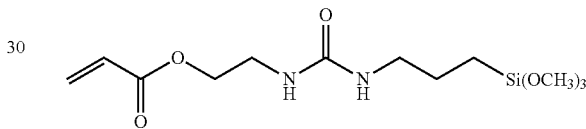

<Synthesis Example 6>Synthesis of a Polyfunctional (Meth)Acryl Group-Containing Silane Condensate AK In Synthesis Example 5, to the precursor of the polyfunctional (meth)acryl group-containing silane condensate P-AK was further added 641 g of isopropyl alcohol, and the resulting mixture was stirred at a room temperature for 30 minutes, followed by the addition of 80 g of a 2.38% aqueous solution of tetramethylammonium hydroxide. The resulting mixture was stirred at a room temperature for 24 hours and allowed to undergo a hydrolysis and condensation reaction. After that, 500 g of methyl isobutyl ketone was added, and the resulting mixture was washed with water, followed by the removal of a solvent, using an evaporator. The weight average molecular weight of the resulting reactant was 4,100.

<Synthesis Example 7>Synthesis of a Polyfunctional (Meth)Acryl Group-Containing Silane Condensate MK To a 1-L four-necked flask equipped with a stirrer, a thermometer, a dropping funnel and a reflux condenser tube was added 89.65 g (0.50 mol) of 3-aminopropyl trimethoxysilane (manufactured by Shin-Etsu Chemical Co., Ltd., KBM-903). In an ice bath, 77.58 g (0.50 mol) of 2-isocyanatoethyl methacrylate (manufactured by Showa Denko K.K., "Karenz" MOI) was added dropwise slowly using the dropping funnel, and then mixture was allowed to react at 40° C. for 8 hours. The reaction was terminated as the disappearance of the absorption of the isocyanate group was confirmed in infrared spectroscopy. The resulting mixture was cooled down to a room temperature, and the compound represented by the following Formula was obtained. The molecular weight was 334.44.

[Chem 25]

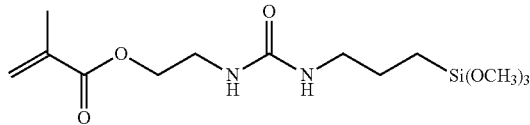

Further, 641 g of isopropyl alcohol was added, and the resulting mixture was stirred at a room temperature for 30 minutes, followed by the addition of 80 g of a 2.38% aqueous solution of tetramethylammonium hydroxide. The resulting mixture was stirred at a room temperature for 24 hours and allowed to undergo a hydrolysis and condensation reaction. After that, 500 g of methyl isobutyl ketone was added, and the resulting mixture was washed with water, followed by the removal of a solvent, using an evaporator. The weight average molecular weight of the resulting reactant was 3,800.

<Synthesis Example 8>Synthesis of a Novolac Resin NOV

Under a dry nitrogen gas flow, 70.2 g (0.65 mol) of m-cresol, 37.8 g (0.35 mol) of p-cresol, 75.5 g of a 37% by weight aqueous solution of formaldehyde (formaldehyde 0.93 mol), 0.63 g (0.005 mol) of oxalic acid dihydrate, 264 g of methyl isobutyl ketone were introduced and immersed in an oil bath. While the reaction solution was refluxed, the polycondensation reaction was performed for 4 hours. After that, the temperature of the oil bath was raised over 3 hours, and then the pressure in the flask was reduced to 40 to 67 hPa to remove a volatile content. The temperature was decreased to a room temperature and a polymer solid of a novolac resin was obtained. The weight average molecular weight determined by GPC was 3500.

Example 1

The following substances were added to a mixture of 10.50 g of γ-butyrolactone and 7.00 g of ethyl lactate and the resulting mixture was stirred to obtain varnish of a photosensitive resin composition:
as an alkali-soluble resin (A), 10.0 g of the polyimide from Synthesis Example 1,
as an acryl group-containing compound (B), 1.20 g of the polyfunctional (meth)acryl group-containing silane condensate AK from Synthesis Example 6, which is also the polyfunctional (meth)acryl group-containing silane condensate (B1),
1.80 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 2

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as an acryl group-containing compound (B), 1.80 g of the polyfunctional (meth)acryl group-containing silane condensate AK from Synthesis Example 6, which is also the polyfunctional (meth)acryl group-containing silane condensate (B1), and 2.70 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 3

The following substances were added to a mixture of 12.70 g of γ-butyrolactone and 8.50 g of ethyl lactate and the resulting mixture was stirred to obtain varnish of a photosensitive resin composition:
as an alkali-soluble resin (A), 10.0 g of the polyimide from Synthesis Example 1,
as an acryl group-containing compound (B), 2.40 g of the polyfunctional (meth)acryl group-containing silane condensate AK from Synthesis Example 6, which is also the polyfunctional (meth)acryl group-containing silane condensate (B1), and 3.60 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 4

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as a (meth)acryl group-containing compound (B), 1.80 g of the polyfunctional (meth)acryl group-containing silane condensate MK from Synthesis Example 7,
which is also the polyfunctional (meth)acryl group-containing silane condensate (B1), and 2.70 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.

The resulting varnish was used to carry out the evaluation of the cross-sectional shape, the chemical resistance, and the electrical insulation property according to the methods described above.

Example 5

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as an acryl group-containing compound (B), 1.80 g of the polyfunctional (meth)acryl group-containing silane condensate AK from Synthesis Example 6, which is also the polyfunctional (meth)acryl group-containing silane condensate (B1), and 2.70 g of pentaerythritol triacrylate (PET 3A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 6

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as an (meth)acryl group-containing compound (B), 1.80 g of the polyfunctional (meth)acryl group-containing silane condensate AK from Synthesis Example 6,
which is also the polyfunctional (meth)acryl group-containing silane condensate (B1), 1.35 g of pentaerythritol tetraacrylate (PET 4A), and 1.35 g of pentaerythritol triacrylate (PET 3A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 7

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as an (meth)acryl group-containing compound (B), 1.80 g of the polyfunctional (meth)acryl group-containing silane condensate AK from Synthesis Example 6,
which is also the polyfunctional (meth)acryl group-containing silane condensate (B1), 0.90 g of pentaerythritol tetraacrylate (PET 4A), 0.90 g of pentaerythritol triacrylate (PET 3A), and 0.90 g of dipentaerythritol hexaacrylate (DPHA),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 8

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as a (meth)acryl group-containing compound (B), 2.70 g of the polyfunctional (meth)acryl group-containing silane condensate AK from Synthesis Example 6,
which is also the polyfunctional (meth)acryl group-containing silane condensate (B1), and 1.80 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 9

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as a (meth)acryl group-containing compound (B), 1.35 g of the polyfunctional (meth)acryl group-containing silane condensate AK from Synthesis Example 6,
which is also the polyfunctional (meth)acryl group-containing silane condensate (B1), and 3.15 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 10

The following substances were added to a mixture of 11.60 g of γ-butyrolactone and 7.80 g of ethyl lactate and the resulting mixture was stirred to obtain varnish of a photosensitive resin composition:

as an alkali-soluble resin (A), 10.0 g of the polyimide precursor from Synthesis Example 3,
as an acryl group-containing compound (B), 1.80 g of the polyfunctional (meth)acryl group-containing silane condensate AK from Synthesis Example 6, which is also the polyfunctional (meth)acryl group-containing silane condensate (B1), and 2.70 g of pentaerythritol tetraacrylate (PET 4A) which is not (B1),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 11

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polybenzoxazole precursor from Synthesis Example 4,
as an acryl group-containing compound (B), 1.80 g of the polyfunctional (meth)acryl group-containing silane condensate AK from Synthesis Example 6, which is also the polyfunctional (meth)acryl group-containing silane condensate (B1), and 2.70 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Example 12

The following substances were added to a mixture of 11.60 g of γ-butyrolactone and 7.80 g of ethyl lactate and the resulting mixture was stirred to obtain varnish of a photosensitive resin composition:
as an alkali-soluble resin (A), 10.0 g of the polyimide from Synthesis Example 1,
as an acryl group-containing compound (B), 4.50 g of the polyfunctional (meth)acryl group-containing silane condensate AK from Synthesis Example 6, which is also the polyfunctional (meth)acryl group-containing silane condensate (B1),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Comparative Example 1

The following substances were added to 11.60 g of γ-butyrolactone and 7.80 g of ethyl lactate and stirred to obtain varnish of a photosensitive resin composition:
as an alkali-soluble resin (A), 10.0 g of the polyimide from Synthesis Example 1,
as an acryl group-containing compound (B), 4.50 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Comparative Example 2

The following substances were added to 11.60 g of γ-butyrolactone and 7.80 g of ethyl lactate and stirred to obtain varnish of a photosensitive resin composition: as an alkali-soluble resin (A), 10.0 g of the polyimide from Synthesis Example 1,
as an acryl group-containing compound (B), 1.80 g of the precursor of the polyfunctional (meth)acryl group-containing silane condensate P-AK from Synthesis Example 5, which is also the polyfunctional (meth)acryl group-containing silane condensate (B1) with a smaller molecular weight, and 2.70 g of pentaerythritol tetraacrylate (PET 4A),
as a photopolymerization initiator (C), 0.70 g of NCI-831,
as a thermal cross-linking agent (D), 0.50 g of NIKALAC MX-270,
as an adherence improving agent, 0.15 g of KBM-403,
as a surfactant, 0.01 g of POLYFLOW No. 77.
The resulting varnish was used to carry out the evaluation of the cross-sectional shape, the chemical resistance, and the electrical insulation property according to the methods described above.

Comparative Example 3

To a mixture of 11.60 g of γ-butyrolactone and 7.80 g of ethyl lactate were added 10.0 g of the novolac resin NOV of Synthesis Example 8 as (A) the alkali-soluble resin (A), 1.80 g of the polyfunctional (meth)acryl group-containing silane condensate AK from Synthesis Example 6, which is also the polyfunctional (meth)acryl group-containing silane condensate (B1), and 2.70 g of pentaerythritol tetraacrylate (PET 4A) as the acryl group-containing compound (B), 0.70 g of NCI-831 as the photopolymerization initiator (C), 0.50 g of NIKALAC MX-270 as the (D) thermal cross-linking agent, a thermal cross-linking agent (D), 0.15 g of KBM-403 as the adherence improving agent, 0.01 g of POLYFLOW No. 77 manufactured by Kyoeisha Chemical Co., Ltd. as the surfactant, and the resulting mixture was stirred to obtain varnish of a photosensitive resin composition. The resulting varnish was used to carry out the evaluation of the cross-sectional shape, the chemical resistance, and the electrical insulation property according to the methods described above.

The compositions and evaluation results as described above are shown in Table 1 for Examples 1 to 8, and in Table 2 for Examples 9 to 12 and Comparative Examples 1 to 3.

TABLE 1

A

| No. | Resin (A) | Acryl group-containing compound (B) | | Photopolymerization initiator (C) | Thermal cross-linking agent (D) | Other component (1) | Other component (2) |
| --- | --- | --- | --- | --- | --- | --- | --- |
| | | Polyfunctional acryl group-containing silane condensate (B1) | Polyfunctional acryl group-containing compound (B2) | | | | |
| Example 1 | Polyimide | AK | PET4A | NCI-831 | MX-270 | KBM-403 | POLYFLOW 77 |
| | 10.00 g | 1.20 g | 1.80 g | 0.70 g | 0.50 g | 0.15 g | 0.01 g |
| | | Total of 3.0 g | | | | | |
| Example 2 | Polyimide | AK | PET4A | NCI-831 | MX-270 | KBM-403 | POLYFLOW 77 |
| | 10.00 g | 1.80 g | 2.70 g | 0.70 g | 0.50 g | 0.15 g | 0.01 g |
| | | Total of 4.5 g | | | | | |
| Example 3 | Polyimide | AK | PET4A | NCI-831 | MX-270 | KBM-403 | POLYFLOW 77 |
| | 10.00 g | 2.40 g | 3.60 g | 0.70 g | 0.50 g | 0.15 g | 0.01 g |
| | | Total of 6.0 g | | | | | |
| Example 4 | Polyimide | MK | PET4A | NCI-831 | MX-270 | KBM-403 | POLYFLOW 77 |
| | 10.00 g | 1.80 g | 2.70 g | 0.70 g | 0.50 g | 0.15 g | 0.01 g |
| | | Total of 4.5 g | | | | | |
| Example 5 | Polyimide | AK | PET3A | NCI-831 | MX-270 | KBM-403 | POLYFLOW 77 |
| | 10.00 g | 1.80 g | 2.70 g | 0.70 g | 0.50 g | 0.15 g | 0.01 g |
| | | Total of 4.5 g | | | | | |
| Example 6 | Polyimide | AK | PET4A/PET3A | NCI-831 | MX-270 | KBM-403 | POLYFLOW 77 |
| | 10.00 g | 1.80 g | 1.35 g/1.35 g | 0.70 g | 0.50 g | 0.15 g | 0.01 g |
| | | Total of 4.5 g | | | | | |
| Example 7 | Polyimide | AK | PET4A/PET3A/DPHA | NCI-831 | MX-270 | KBM-403 | POLYFLOW 77 |
| | 10.00 g | 1.80 g | 0.90 g/0.90 g/0.90 g | 0.70 g | 0.50 g | 0.15 g | 0.01 g |
| | | Total of 4.5 g | | | | | |
| Example 8 | Polyimide | AK | PET4A | NCI-831 | MX-270 | KBM-403 | POLYFLOW 77 |
| | 10.00 g | 2.70 g | 1.80 g | 0.70 g | 0.50 g | 0.15 g | 0.01 g |
| | | Total of 4.5 g | | | | | |

B

| No. | Organic solvent (1) | Organic solvent (2) | Cross-sectional Shape | Chemical resistance Film thickness variation | Crack peeling | Electrical insulation |
| --- | --- | --- | --- | --- | --- | --- |
| Example 1 | GBL 10.50 g | EL 7.00 g | 4 | 3 | Good | 3 |
| Example 2 | GBL 11.60 g | EL 7.80 g | 4 | 3 | Good | 3 |
| Example 3 | GBL 12.70 g | EL 8.50 g | 4 | 2 | Good | 2 |
| Example 4 | GBL 11.60 g | EL 7.80 g | 4 | 3 | Good | 3 |
| Example 5 | GBL 11.60 g | EL 7.80 g | 3 | 3 | Good | 3 |
| Example 6 | GBL 11.60 g | EL 7.80 g | 4 | 3 | Good | 3 |
| Example 7 | GBL 11.60 g | EL 7.80 g | 4 | 3 | Good | 3 |
| Example 8 | GBL 11.60 g | EL 7.80 g | 3 | 3 | Good | 3 |

TABLE 2

| No. | Resin (A) | Acryl group-containing compound (B) | | Photopolymerization initiator (C) | Thermal cross-linking agent (D) | Other component (1) | Other component (2) |
|---|---|---|---|---|---|---|---|
| | | Polyfunctional acryl group-containing silane condensate (B1) | Polyfunctional acryl group-containing compound (B2) | | | | |
| Example 9 | Polyimide 10.00 g | AK 1.35 g | PET4A 3.15 g | NCI-831 0.70 g | MX-270 0.50 g | KBM-403 0.15 g | POLYFLOW 77 0.01 g |
| | | Total of 4.5 g | | | | | |
| Example 10 | Polyimide precursor 10.00 g | AK 1.80 g | PET4A 2.70 g | NCI-831 0.70 g | MX-270 0.50 g | KBM-403 0.15 g | POLYFLOW 77 0.01 g |
| | | Total of 4.5 g | | | | | |
| Example 11 | PBO precursor 10.00 g | AK 1.80 g | PET4A 2.70 g | NCI-831 0.70 g | MX-270 0.50 g | KBM-403 0.15 g | POLYFLOW 77 0.01 g |
| | | Total of 4.5 g | | | | | |
| Example 12 | Polyimide 10.00 g | AK 4.50 g | — 0.00 g | NCI-831 0.70 g | MX-270 0.50 g | KBM-403 0.15 g | POLYFLOW 77 0.01 g |
| | | Total of 4.5 g | | | | | |
| Comparative Example 1 | Polyimide 10.00 g | AK 0.00 g | PET4A 4.50 g | NCI-831 0.70 g | MX-270 0.50 g | KBM-403 0.15 g | POLYFLOW 77 0.01 g |
| | | Total of 4.5 g | | | | | |
| Comparative Example 2 | Polyimide 10.00 g | P-AK 1.8 g | PET4A 2.7 g | NCI-831 0.70 g | MX-270 0.50 g | KBM-403 0.15 g | POLYFLOW 77 0.01 g |
| | | Total of 4.5 g | | | | | |
| Comparative Example 2 | NOV 10.00 g | AK 1.80 g | PET4A 2.70 g | NCI-831 0.70 g | MX-270 0.50 g | KBM-403 0.15 g | POLYFLOW 77 0.01 g |
| | | Total of 4.5 g | | | | | |

| No. | Organic solvent (1) | Organic solvent (2) | Cross-sectional Shape | Chemical resistance Film thickness variation | Crack peeling | Electrical insulation |
|---|---|---|---|---|---|---|
| Example 9 | GBL 11.60 g | EL 7.80 g | 3 | 3 | Good | 3 |
| Example 10 | GBL 11.60 g | EL 7.80 g | 4 | 3 | Good | 3 |
| Example 11 | GBL 11.60 g | EL 7.80 g | 4 | 3 | Good | 3 |
| Example 12 | GBL 11.60 g | EL 7.80 g | 2 | 3 | Good | 3 |
| Comparative Example 1 | GBL 11.60 g | EL 7.80 g | 1 | 3 | Good | 3 |
| Comparative Example 2 | GBL 11.60 g | EL 7.80 g | 1 | 3 | Good | 3 |
| Comparative Example 2 | GBL 11.60 g | EL 7.80 g | 4 | 1 | Poor | 1 |

In Tables, "polyimide" corresponds to the polyimide of Synthesis Example 1, and "polyimide precursor" corresponds to polyimide of Synthesis Example 3.

DESCRIPTION OF THE REFERENCE NUMERALS

1: substrate
2a, 2b, 2c, 2d, 2e, 2f: insulating films
3a, 3b, 3c, 3d: coil conductor layers
4a, 4b: through-hole portions
21: substrate
22: cured relief pattern
23: opening portion
24: angle of the taper

The invention claimed is:

1. A photosensitive resin composition, comprising
an alkali-soluble resin (A) comprising at least one selected from polyimides and precursors thereof, and polybenzoxazoles and precursors thereof, and
a (meth)acryl group-containing compound (B),
wherein the (meth)acryl group-containing compound (B) comprises
a polyfunctional (meth)acryl group-containing silane condensate (B1) having a plurality of structures represented by Formula (1), the silane condensate (B1) being a condensate of compounds having a structure represented by Formula (1) and at least one structure selected from Formula (2-1), Formula (2-2), and Formula (2-3), and
the compound (B1) has a weight average molecular weight of 1,000 to 20,000,

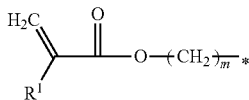
(1)

wherein in Formula (1), $R^1$ is a hydrogen atom or a methyl group, m is an integer in a range of $1 \leq m \leq 4$, and the symbol * indicates a binding site;

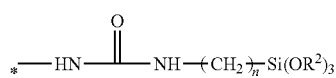
(2-1)

wherein in Formula (2-1), $R^2$ is a methyl group or an ethyl group, n is an integer in a range of $1 \leq n \leq 4$, and the symbol * indicates a binding site;

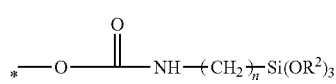
(2-2)

wherein in Formula (2-2), $R^2$ is a methyl group or an ethyl group, n is an integer in a range of $1 \leq n \leq 4$, and the symbol * indicates a binding site; and

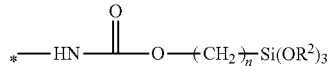
(2-3)

wherein in Formula (2-3), $R^2$ is a methyl group or an ethyl group, n is an integer in a range of $1 \leq n \leq 4$, and the symbol * indicates a binding site.

2. The photosensitive resin composition according to claim 1, wherein the (meth)acryl group-containing compound (B) further comprises a polyfunctional (meth)acryl group-containing compound (B2) which is at least one selected from compounds represented by Formula (3) and compounds represented by Formula (4):

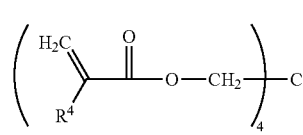
(3)

wherein in Formula (3), $R^4$ is a hydrogen atom or a methyl group; and

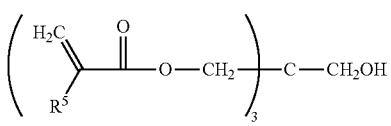
(4)

wherein in Formula (4), $R^5$ is a hydrogen atom or a methyl group.

3. The photosensitive resin composition according to claim 2, wherein the polyfunctional (meth)acryl group-containing compound (B2) is 50 to 300 parts by mass based on 100 parts by mass of the total amount of the polyfunctional (meth)acryl group-containing silane condensate (B1).

4. The photosensitive resin composition according to claim 1, wherein the acryl group-containing compound (B) is 20 to 70 parts by mass based on 100 parts by mass of the (A) alkali-soluble resin (A).

5. A resin sheet comprising the photosensitive resin composition of claim 1.

6. A method of producing an interlayer insulating film or a passivation film, comprising the steps of:
forming a photosensitive resin composition layer or a resin layer on a substrate by a step of coating the photosensitive resin composition of claim 1 on the substrate or a step of laminating a resin sheet formed from the photosensitive resin composition of claim 1 on the substrate;
forming a pattern by irradiation with ultraviolet rays and development; and
forming a layer of a cured relief pattern by heating.

* * * * *